(12) United States Patent
Furukawa et al.

(10) Patent No.: US 8,064,211 B2
(45) Date of Patent: Nov. 22, 2011

(54) PASSIVE COMPONENT AND ELECTRONIC COMPONENT MODULE

(75) Inventors: Hirotada Furukawa, Tokyo (JP); Toshiaki Kikuchi, Tokyo (JP); Yutaka Sato, Tokyo (JP); Takaaki Domon, Tokyo (JP); Yoshio Kaita, Tokyo (JP)

(73) Assignee: TDK Corporation, Tokyo (JP)

( * ) Notice: Subject to any disclaimer, the term of this patent is extended or adjusted under 35 U.S.C. 154(b) by 11 days.

(21) Appl. No.: 11/896,070

(22) Filed: Aug. 29, 2007

(65) Prior Publication Data

US 2008/0055859 A1 Mar. 6, 2008

(30) Foreign Application Priority Data

Aug. 31, 2006 (JP) .............................. P2006-236981
Aug. 31, 2006 (JP) .............................. P2006-236982
Aug. 13, 2007 (JP) .............................. P2007-210947

(51) Int. Cl.
*H05K 7/00* (2006.01)
(52) U.S. Cl. ...................................... 361/760; 174/260
(58) Field of Classification Search .................. 361/748, 361/760, 761; 174/260, 262
See application file for complete search history.

(56) References Cited

U.S. PATENT DOCUMENTS

| | | | | |
|---|---|---|---|---|
| 4,574,297 A * | 3/1986 | Ooi ............................... | 257/696 |
| 5,760,456 A * | 6/1998 | Grzegorek et al. ........... | 257/531 |
| 5,889,323 A * | 3/1999 | Tachibana ..................... | 257/704 |
| 6,362,525 B1 * | 3/2002 | Rahim .......................... | 257/738 |
| 6,787,884 B2 * | 9/2004 | Hirano et al. ................. | 257/618 |
| 6,914,322 B2 * | 7/2005 | Iijima et al. .................. | 257/678 |
| 7,285,728 B2 * | 10/2007 | Sunohara et al. ............. | 174/260 |
| 2003/0209788 A1 | 11/2003 | Kobayakawa | |
| 2004/0082100 A1 | 4/2004 | Tsukahara et al. | |
| 2005/0005420 A1 | 1/2005 | Hirano et al. | |
| 2005/0122198 A1 * | 6/2005 | Zhou et al. .................... | 336/200 |
| 2005/0186768 A1 * | 8/2005 | Sugaya et al. ................ | 438/597 |
| 2006/0033199 A1 | 2/2006 | Kawakami et al. | |
| 2006/0114094 A1 | 6/2006 | Jean et al. | |
| 2008/0090335 A1 | 4/2008 | Morimoto et al. | |

FOREIGN PATENT DOCUMENTS

| | | |
|---|---|---|
| CN | 1574128 A | 2/2005 |
| DE | 103 40 069 A1 | 4/2004 |
| JP | A-11-003836 | 1/1999 |
| JP | A-2001-203108 | 7/2001 |
| JP | A-2002-233140 | 8/2002 |
| JP | A-2004-056112 | 2/2004 |
| JP | A-2005-45013 | 2/2005 |
| JP | A 2005-63676 | 3/2005 |
| JP | A 2005-93774 | 4/2005 |

* cited by examiner

*Primary Examiner* — Yuriy Semenenko
(74) *Attorney, Agent, or Firm* — Oliff & Berridge, PLC

(57) ABSTRACT

An electronic component module is configured by a passive component mounted on a built-in IC substrate. The passive component is provided with a passive element inductor, and a mounting surface for mounting on a substrate. Concavities are respectively provided at parts of two opposed borders in the mounting surface, and a terminal electrode is provided at the bottom part of the concavities. Since the passive component has a concavity within the mounting surface and the terminal electrode is incorporated within this concavity, the passive component can be mounted low on the substrate surface. Since the terminal electrode is incorporated in the concavity, solder is prevented from spreading fillet-like at the periphery of the inductor, thus increasing the mounting density of the passive component. There is increased freedom for mounting the passive component because the passive component is mounted on the built-in IC substrate in which the IC is embedded in the substrate.

6 Claims, 40 Drawing Sheets

US 8,064,211 B2

PASSIVE COMPONENT AND ELECTRONIC COMPONENT MODULE

BACKGROUND OF THE INVENTION

1. Field of the Invention

The present invention relates to a passive component, and particularly relates to a passive component mounted on a substrate and an electronic component module with this passive component mounted on a substrate. The present invention further relates to an electronic component module, and particularly relates to an electronic component module in which a passive component is mounted on a built-in IC substrate.

2. Related Background Art

In recent years, compact electronic devices such as portable phones and the like have been configured by various passive components that include passive elements such as inductors and capacitors. Low profile and high density are requirements when mounting passive elements on a substrate and there is no limit to high level integration of electronic components such as portable phones. For example, Japanese Laid-Open Patent Publication No. 2005-93774 discloses art for fixedly attaching a semiconductor chip and a thin film conductive element through a stud bump using ultrasonic bonding.

Japanese Laid-Open patent Publication No. 2004-63676 discloses art for miniaturizing electronic devices such as portable phones by disposing a stud terminal on a module substrate, mounting a micro-inductor in a mounting configuration on the stud terminal, and overlaying the micro-inductor on a semiconductor integrated circuit in a micro-converter configured by a chip component shaped micro-inductor and a control circuit and the like which is used for converting and stabilizing a power source voltage.

SUMMARY OF THE INVENTION

However, since the semiconductor chip and the thin film magnetic inductor are fixedly attached by ultrasonic bonding only through the stud bump rather than through the substrate in the art disclosed in Japanese Laid-Open Patent Publication No. 2005-93774, the semiconductor chip and the thin film magnetic inductor must match closely in size, thus adversely affecting universality and expandability, and reducing design freedom.

Furthermore, since the inductor is mounted with a mounting configuration in which the stud terminal is disposed on the module substrate in the art disclosed in Japanese Laid-Open patent Publication No. 2004-63676, a low profile for the overall module is unrealizable because the disposition of the stud terminal requires a degree of height. However, when the terminal electrode on the inductor side surface is solder-mounted directly on the module substrate without using the stud terminal, the solder spreads fillet-like on the periphery of the inductor such that an actual mounting area larger than the area of the inductor itself is required and high density mounting on the substrate is not possible.

In view of these factors, an object of the present invention is to provide a passive component mountable on a substrate that is both low profile and high density, and provide an electronic component module to which this passive component is mounted. A further object of the present invention is to provide an electronic component module that is both low profile and high density and ensures universality and expandability.

The present invention is a passive component provided with a passive element and a mounting surface for mounting on a substrate, and has a concavity within the mounting surface and incorporates an electrode within this concavity.

Since this configuration has a concavity within the mounting surface and incorporates a terminal electrode within this concavity, which allows a low mounting on the substrate surface even when a terminal protrudes from the substrate. Furthermore, since the terminal electrode is incorporated in the concavity, solder is prevented from spreading fillet-like to the periphery of the passive component, thus reducing the mounting surface area of the passive component. As a result, the passive components can be mounted on the substrate with a low profile and high density.

In this case, ideally a first passive component and a second passive component have a concavity formed within a mounting surface and mutually incorporate a passive element by providing a first passive component and a second passive component and integratedly configuring the first passive component and the second passive component so that the projection surface area on the mounting surface of the second passive component is greater than the projection surface area on the mounting surface of the first passive component.

Since the second passive component exclusively occupies an area on the substrate that is larger than the mounting area when mounted on the substrate and the first passive component and the second passive component mutually incorporate a passive element according to this configuration, the space for accommodating the passive element can be increased compared to the mounting space.

In this case, the concavity is desirably positioned on the margin area of the mounting surface.

This configuration allows easy mounting on a substrate since the concavity that includes an electrode is positioned on the margin of the mounting surface, and uneven height is reduced when the passive components are mounted on the substrate because stability and fixing strength are increased during mounting and the passive components are stably mounted on the substrate.

In this instance, ideally at least a pair of concavities are provided, and the pair of concavities are respectively positioned in position at parts of the margins of the mounting surface.

According to this configuration, fixing strength and stability are improved when the passive component is mounted on the substrate because the pair of concavities that include an electrode are positioned in opposition in parts of the margins of the mounting surface. Furthermore, noise is reduced and power source efficiency is improved since wiring is shortened.

In the present invention the passive element may be an inductor or the passive element may be a capacitor.

Another aspect of the present invention is an electronic component module in which a passive component, which is provided with a passive element and a mounting surface for mounting on a substrate and has a concavity within the mounting surface and incorporates an electrode within the concavity, is mounted on a substrate having wiring such that the wiring and the terminal electrode within the concavity are electrically connected.

The passive component and the substrate with the wiring are in contact at the mounting surface in this case to realize an ideally low profile electronic component module.

The present invention is an electronic module configured by a passive component, which is provided with a passive element and a mounting surface for mounting on a substrate and has a concavity within the mounting surface and incorporates an electrode within the concavity, and a substrate with internal IC in which the IC is embedded in the substrate, and wherein the passive component is mounted on the substrate with internal IC.

This configuration has a concavity within the mounting surface and incorporates a terminal electrode within this concavity, which allows a low mounting on the substrate surface even when a terminal protrudes from the substrate. Furthermore, since the terminal electrode is incorporated in the concavity, solder is prevented from spreading fillet-like to the periphery of the passive component, thus reducing the mounting area of the passive component. Moreover, a low profile is realized since the passive component is mounted on a substrate with internal IC in which an IC is embedded within the substrate, and universality and expandability are realized due to the greater freedom in mounting the passive component. As a result, the low profile and high density of passive components ensures universality and expandability.

In this case, the substrate with internal IC ideally is provided with an extractor electrode to the IC substrate surface disposed on the substrate surface at a position corresponding to the concavity of the passive component, such that the extractor electrode of the built-in IC substrate and the terminal electrode of the passive component are directly connected.

According to this configuration, the passive component and the built-in IC substrate can be bonded more strongly, thus improving the strength of the electronic component module because the extractor electrode to the IC substrate surface is provided on the substrate surface at a position corresponding to the concavity of the passive component, and the extractor electrode of the built-in IC substrate and the terminal electrode of the passive component are directly connected. Furthermore, noise is reduced and power efficiency is improved since wiring is shortened.

Ideally, there is contact between at least a part of the mounting surface of the passive component, other than the concavity, and a part of the substrate surface of the built-in IC substrate.

According to this configuration, the profile of the electronic component module is lower since there is contact between at least a part of the mounting surface of the passive component other than the concavity and a part of the substrate surface of the built-in IC substrate, and heat dissipating characteristics are improved because the heat generated by the IC of the built-in IC substrate escapes to the passive component.

In this instance, the built-in IC substrate is ideally provided with a heat dissipating resin layer as the outermost layer of the substrate surface.

Heat dissipating characteristics are further improved in this configuration since a heat dissipating resin layer is provided as the outermost layer of the substrate surface. The load on the electrode is also lessened because the resin layer relieves stress due to contact with the passive component.

The present invention is an electronic component module configured by a passive component provided with a mounting surface for mounting on a substrate, an opposed surface facing the mounting surface, a passive element having a side surface that intersects the mounting surface and the opposed surface, a terminal electrode provided on the side surface of the passive element, and the side surface has a cross section configuration in which the cross section is perpendicular to the opposed surface and the mounting surface of the passive element and spreads at least partly from the mounting surface toward the opposed surface side, and the built-in IC substrate in which an IC is embedded within the substrate, wherein the passive part is mounted on the built-in IC substrate.

Since, according to this configuration, the cross section configuration of the passive element is such that the side surface of the passive element inclines so as to spread at least partly from the mounting surface side toward the opposed surface side, a formed margin of solder fillet is provided in the space formed by the substrate and the side surface of the passive element when mounted on the substrate. Thus, a low profile is realized and the space between the passive component and other adjacent passive components can be reduced when mounting, which realizes improved integration efficiency. The load on the solder fillet is reduced even when bending stress or the like is applied to the substrate because the open angles formed by the substrate and the side surface of the passive element are acute angles, thereby preventing the occurrence of defects such as cracking and the like in the solder fillet. Moreover, a low profile is realized since the passive component is mounted on a substrate with internal IC in which an IC is embedded within the substrate, and universality and expandability are realized due to the greater freedom in mounting the passive component. As a result, the low profile and high density of passive components ensures universality and expandability.

In this case, the substrate with internal IC ideally is provided with an extractor electrode to the IC substrate surface at a position corresponding to the passive component on the substrate surface, such that the extractor electrode of the built-in IC substrate and the terminal electrode of the passive component are directly connected.

According to this configuration, the passive component and the built-in IC substrate can be bonded more strongly, thus improving the strength of the electronic component module because the extractor electrode to the IC substrate surface is provided on the substrate surface at a position corresponding to the side surface of the passive component, and the extractor electrode of the built-in IC substrate and the terminal electrode of the passive component are directly connected. Furthermore, noise is reduced and power source efficiency is improved since wiring is shortened.

The extractor electrode is ideally formed within the plane of projection when the passive component is projected on the surface of the built-in IC substrate.

Since the extractor electrode is formed within the plane of projection when the passive component is projected on the surface of the built-in IC substrate according to this configuration, the solder fillet collects within the projection plane and is prevented from running outside the plane of projection when the passive component is projected on the surface of the built-in IC substrate, thus realizing more improvement in integration efficiency.

Ideally, there is contact between at least a part of the mounting surface of the passive component and the substrate surface of the built-in IC substrate.

Since there is contact between at least a part of the mounting surface of the passive component and the surface of the built-in IC substrate according to this configuration, an even lower profile electronic component module can be realized, and heat dissipating characteristics are improved because the heat generated by the IC of the built-in IC substrate escapes to the passive component.

In this instance, the built-in IC substrate is ideally provided with a heat dissipating resin layer as the outermost layer of the substrate surface.

Heat dissipating characteristics are further improved in this configuration since a heat dissipating resin layer is provided as the outermost layer of the substrate surface. The load on the electrode is also lessened because the resin layer relieves stress due to contact with the passive component.

DESCRIPTION OF THE PREFERRED EMBODIMENTS

The embodiments of the electronic component module of the present invention are described hereinafter with reference to the figures.

Figure 1A:
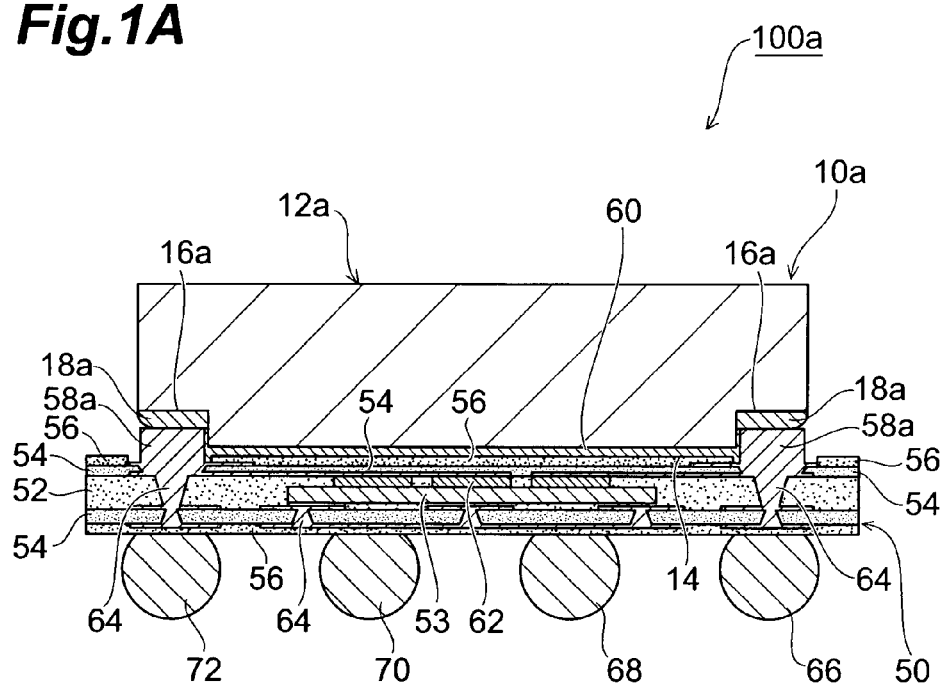
FIG. 1A is a vertical section view showing a first embodiment of an electronic component module.
Figure 1B:
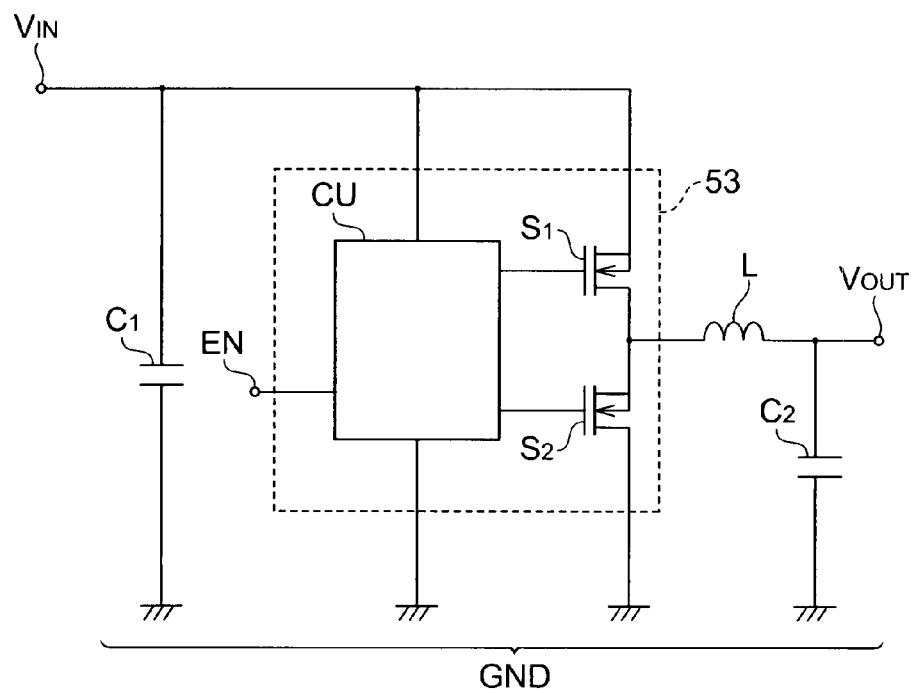
FIG. 1B is a typical circuit diagram of a DC-DC converter composed by the electronic component module.

FIG. 1A is a vertical section view showing a first embodiment of an electronic component module. As shown in FIG. 1, the electronic component module 100a of the present embodiment is configured by a passive component 10a, which is described later, mounted on a built-in IC substrate 50, and provides the function, for example, of a DC-DC converter or the like in a power circuit of a portable telephone. In this instance, one terminal electrode 18a of the passive component 10a provides the function of an SW terminal for supplying a switching voltage, and another terminal electrode 18a provides the function of an output terminal $V_{out}$. The typical circuit diagram of the DC-DC converter is shown in FIG. 1B.

The built-in IC substrate 50 has an IC 53 embedded therein that provides the function of a switching circuit or the like within a support substrate 52. A resin layer 54 and resist 56 are sequentially laminated on the rear surface of the support substrate 52. Furthermore, on the front/back surface of the support substrate, a pad 58a projects from the substrate surface to form the extractor electrode of the IC 53 at a position corresponding to a concavity 16a of the passive component 10a. The IC 53 is positioned on the inner side of the passive component 10a between the pair of terminal electrodes 18a. From the perspective of noise reduction, it is desirable that only a single IC 53 is disposed on the inner side of the passive component 10a between the pair of terminal electrodes 18a. The pad 58a and the concavity 16a of the passive component 10a can be connected by solder or the like and the pad 58a and the concavity 16a of the passive component 10a need not necessarily be disposed so as to be precisely fitted. Mounting is facilitated and stress after bonding can be relieved by allowing a predetermined amount of mutual play.

A via 64 is formed so as to pass through the front and rear surfaces of the substrate at parts of the built-in IC substrate 50 including directly below the pad 58a, and the passive component 10a and the IC 53 are electrically connected through an IC bump 62 of the IC 53. Thus, the IC 53 and the passive component 10a are directly connected from the extractor electrode of the IC 53 and not through the inner region of the IC 53. Furthermore, the via 64 electrically connects the rear surface $V_{in}$ (voltage input terminal) bump 66, the EN (enable terminal) bump 68, the FB (voltage feedback terminal) bump 70, and GND (ground terminal) bump 72 of the built-in IC substrate 50. Thus, by connecting the passive component 10a directly with the wiring pulled out electrically from IC 53 via Pad 58a, it can arrange distance between IC 53 and inductor L on the circuit diagram shown in FIG. 1B at the shortest, high integration is not only expectable, but high efficiency can attain as a DC-DC converter. A heat dissipating resin layer 60 (underfill) is formed on the outermost layer of the built-in IC substrate 50, and the part in the center of the mounting surface 14 of the passive component 10a which does not have the concavity 16a is in contact with the surface of the built-in IC substrate 50 through this heat dissipating resin layer 60. Heat from IC can be efficiently radiated because the mounting surface 14 is in contact directly.

Figure 2:
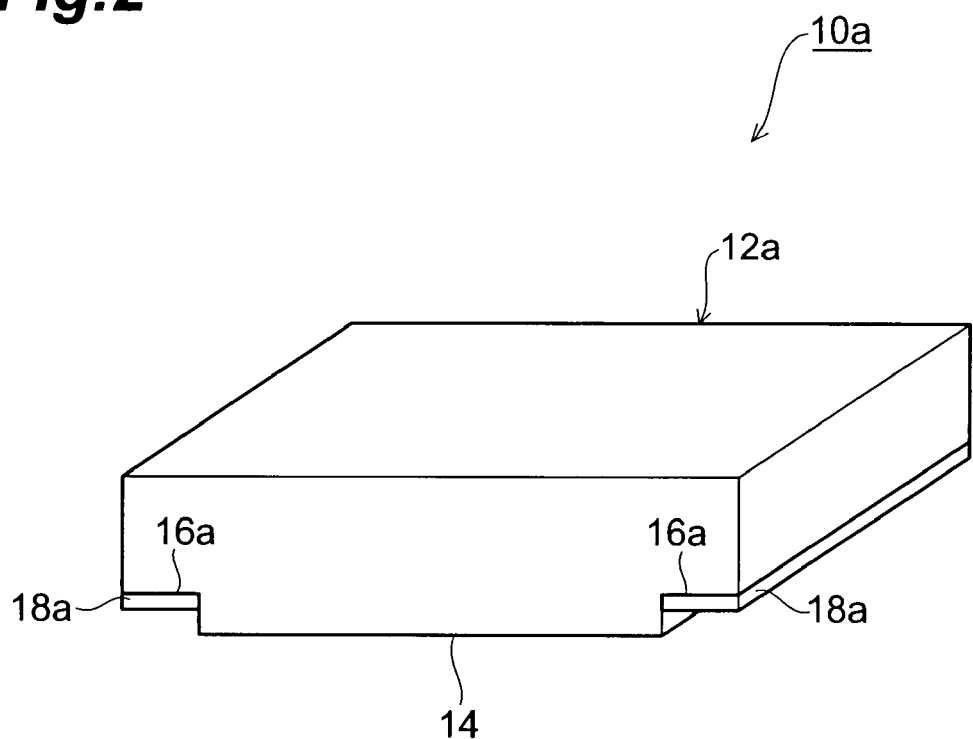
FIG. 2 is a perspective view of the passive component of the first embodiment shown from the side.
Figure 3:
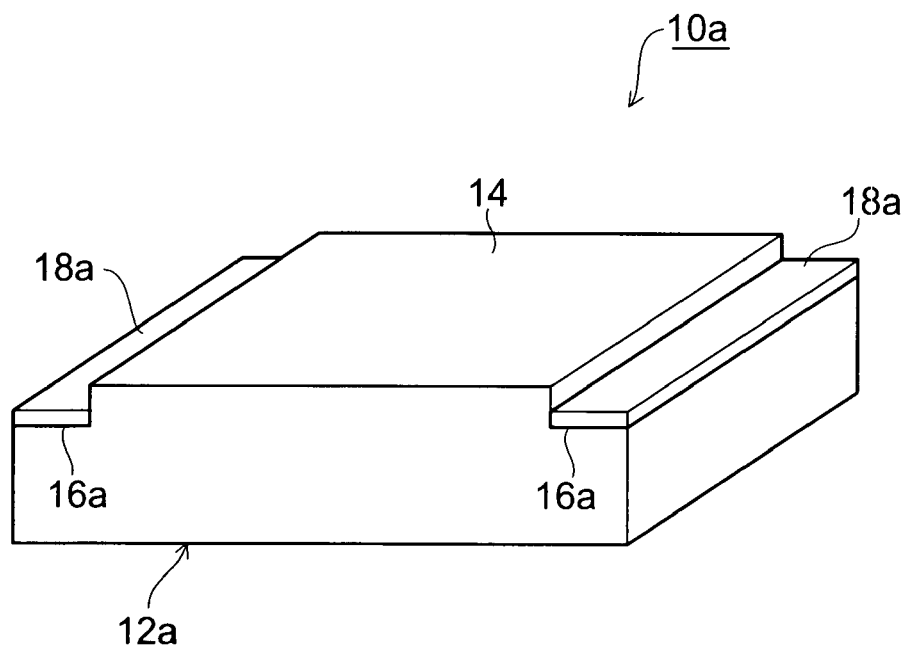
FIG. 3 is a perspective view of the passive component of the first embodiment shown from the bottom side.

FIG. 2 is a perspective view showing the passive component of the first embodiment from the side, and FIG. 3 is a perspective view of the passive component of the first embodiment shown from the bottom side. As shown in FIGS. 2 and 3, in total the passive component 10a has a flat plate configuration 1.5 to 3.5 mm long, 1.0 to 3.0 mm wide, and not more than 1.0 mm high, and is provided with an inductor 12a and a mounting surface 14 for mounting on the built-in IC substrate 50. Although the overall configuration of the passive component 10a may be other than flat plate-like, such as cylindrical, polygonal or the like, as low a height as possible from the mounting surface 14 is desirable from the standpoint of a low profile when mounting on the built-in IC substrate 50. Concavities 16a are respectively provided at parts of two sides facing the mounting surface 14 which has a rectangular configuration, and a terminal electrode 18a is provided at the bottom part of the concavities 16a. The concavities 16a which include the terminal electrodes 18a may also be respectively provided at the corners facing the interior of the rectangular mounting surface 14, that is, on the diagonal.

As shown in FIGS. 2 and 3, the terminal electrodes 18a of the passive component 10a are provided so as to enter the inner side in at least two axial dimensions within the three axial dimensions of length, width, and height mutually intersecting the inductor 12a, that is, the terminal electrodes 18a are provided at the ends of the inductor 12a to ensure as far as possible the maximum space for the inductor 12a in the minimum dimensions.

Figure 4:
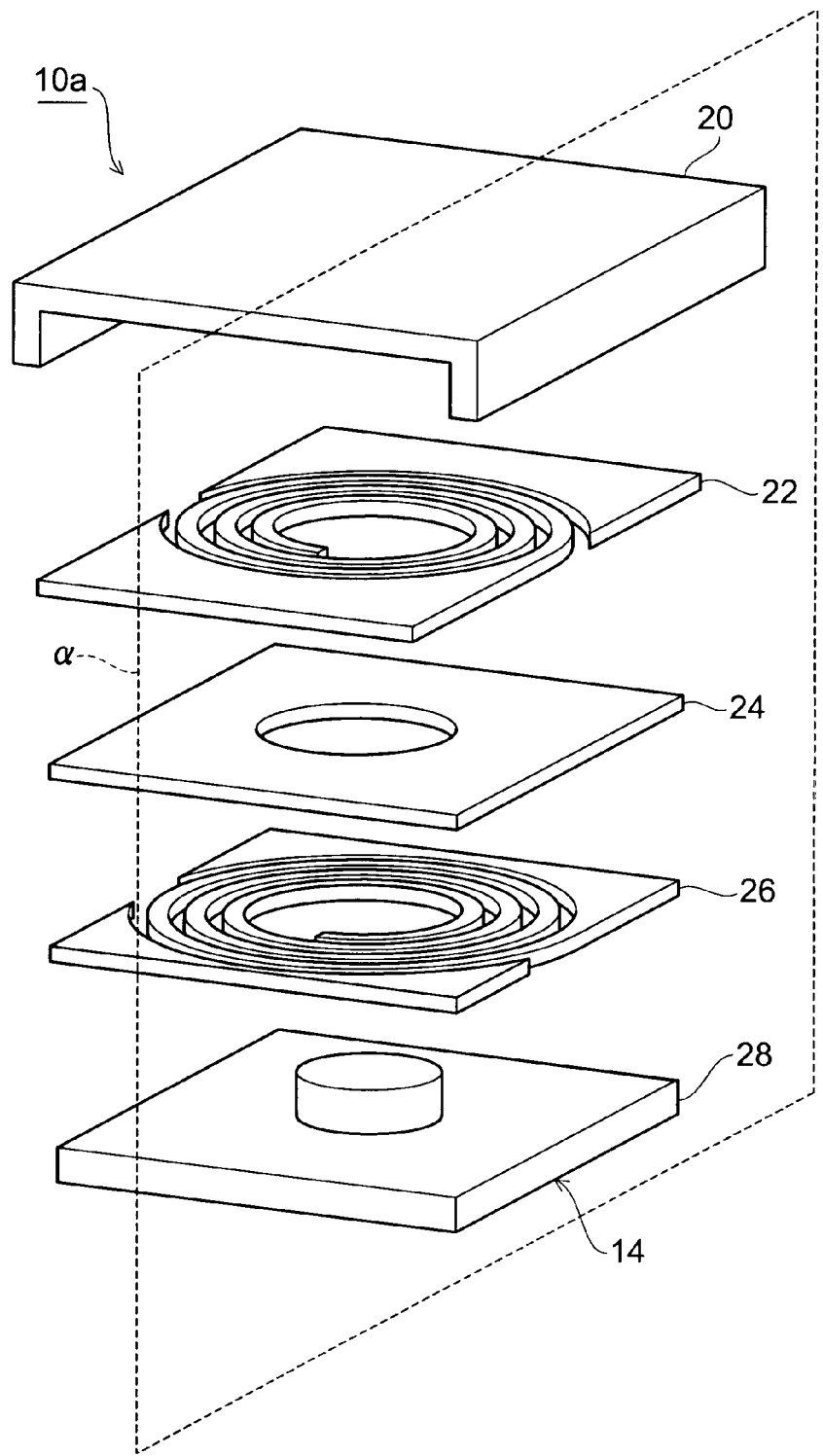
FIG. 4 is an exploded perspective view showing the internal structure of the passive component of the first embodiment.

FIG. 4 is an exploded perspective view showing the internal structure of the passive component of the first embodiment. As shown in FIG. 4, before the concavity 16a and terminal electrode 18a are formed, the passive component 10a is configured by laminations of an top ferrite core 20, top winding 22, printed board 24, bottom winding 26, and bottom ferrite core 28. The top winding 22 and bottom winding 26 are respectively formed on the front and rear surface of the printed board 24 with the printed board 24 sandwiched therebetween, and are electrically connected. A large current can flow compared to a laminate type inductor, and a lower profile can be obtained compared to a wound type inductor by interposing the top winding 22, printed board 24, and bottom winding 26 between the top ferrite core 20 and the bottom ferrite core 28.

Figure 5:
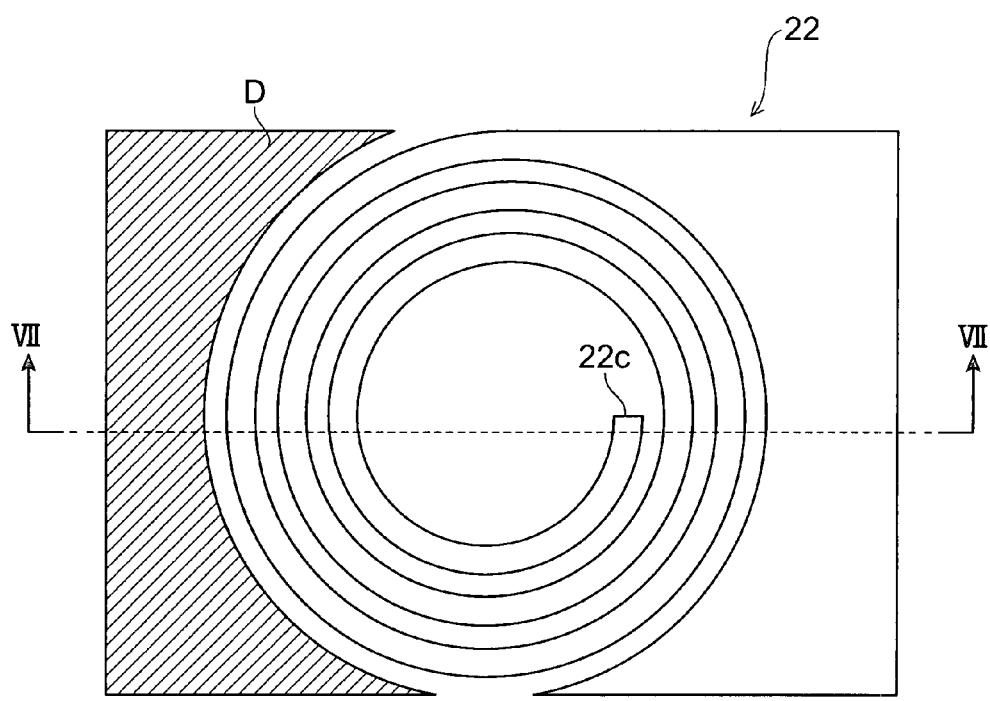
FIG. 5 is a top view showing a top winding.
Figure 6:
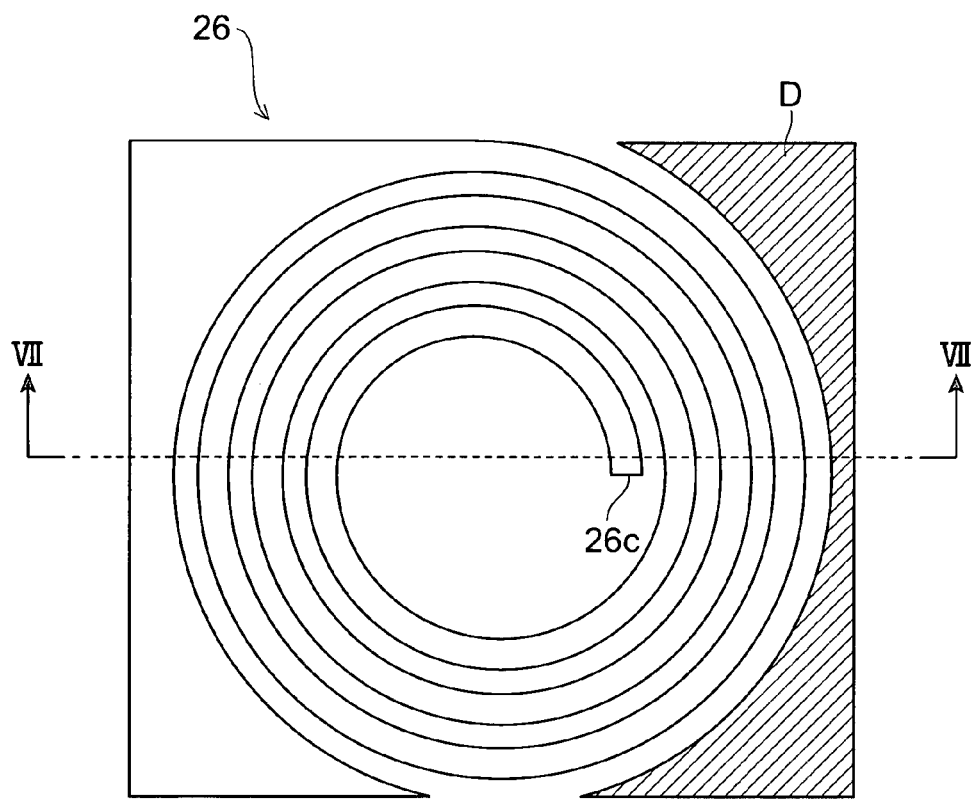
FIG. 6 is a top view showing a bottom winding.

FIGS. 5 and 6 are plane views of top winding 22 and bottom winding 26, respectively. As shown in FIGS. 5 and 6, top winding 22 and bottom winding 26 are making the shape of a spiral to the opposite direction, respectively. When top winding 22 and bottom winding 26 are piled up mutually, the top winding end 22c of top winding 22 and the bottom winding end 26c of bottom winding 26 become almost the same in a level position. The portion of the dummy D of top winding 22 and bottom winding 26 is not connected electrically with the portion of top winding 22 and bottom winding 26 which serves as winding. Because there is such a dummy D, a contact surface with solder can increase and the junction intensity at the time of mounting can be improved.

Figure 7:
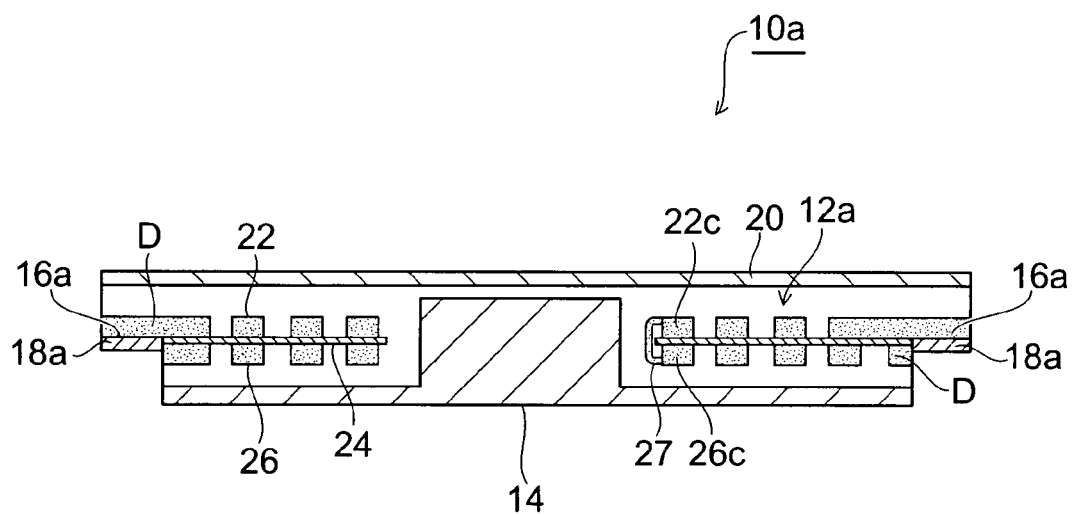
FIG. 7 is a vertical section view showing a first embodiment of the passive component.

FIG. 7 is a vertical section view showing the passive component of the first embodiment and shows the section by the a surface in FIG. 4, and the section by the VII line in FIG. 5-6. Since the terminal electrode 18a is actually mounted after providing the concavities 16a following the lamination of the top ferrite core 20 and the like as described later, a part of the mounting surface 14 side that includes the concavity 16a and any other part outside of this part of the passive component 10a are exclusively occupied by the top winding 22 and bottom winding 26 and the like of the inductor 12a, such that the inductor 12a can have minimum dimensions relative to volume as shown in FIG. 5.

Although the plane type spiral coil is used with this embodiment, this invention is not limited to the plane type spiral coil and the solenoid type coil which the direction of that coil becomes parallel to a mounting surface may be sufficient. The plane type spiral coil is advantageous when mounting in the point that the thickness on a substrate becomes the minimum more.

Although ferrite cores are used in the present embodiment, the magnetic material is not specifically limited to a ferrite core inasmuch as various materials may be used including magnetic metal materials, and oxides of magnetic materials. Moreover, the printed board is not particularly problematic insofar as an insulating material is used; resin substrates and insulating ceramic substrates are widely usable.

Figure 8A:
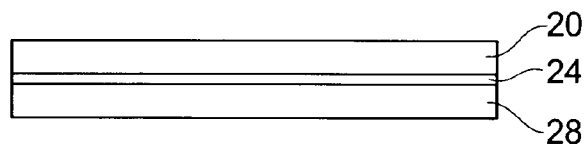
FIG. 8A through 8E show the manufacturing process of the passive component.
Figure 8B:
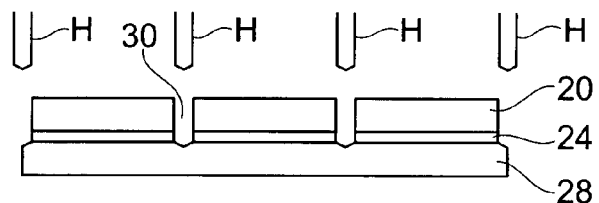

FIGS. 8A-8E show the passive component manufacturing process. When manufacturing the passive component 10a of the present embodiment, the top ferrite core 20, printed board 24 on which the windings are formed on front and rear surfaces, and the bottom ferrite core 28 are laminated to form a long plate-like body, as shown in FIG. 8A.

As shown in FIG. 8A, dicing is not performed to a depth that completely and mutually separates the plate-like body, rather half dicing is performed to reach the printed board 24 by a wide width dicer H. This half dicing forms half diced parts 30 in the plate-like body, thus exposing the conductive metal of the interior area to form the concavities of the passive element.

Figure 8C:
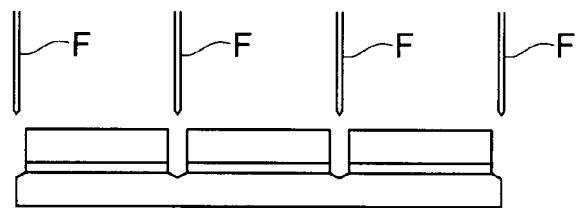
Figure 8D:
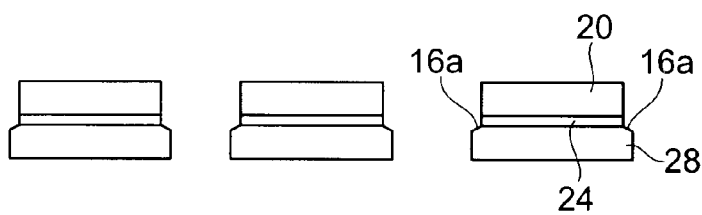

As shown in FIG. 8C, a narrow width dicer F is used to perform full dicing of the half diced parts 30 to a depth that completely separates the plate like body. This full dicing separates the plate-like body in the size of individual passive elements, and forms the concavities 16a, as shown in FIG. 8D.

Figure 8E:
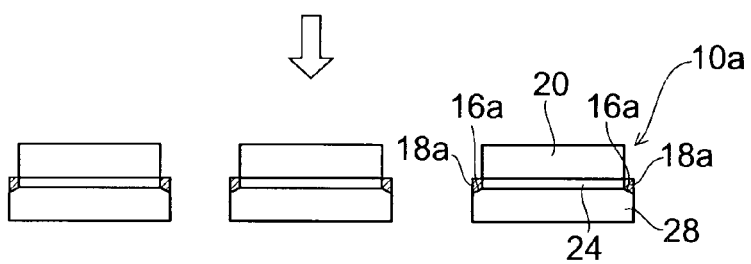

The passive component 10a can be manufactured by forming the terminal electrode 18a in the concavity 16a, as shown in FIG. 8E. Furthermore, the sequence of the formation of the terminal electrode 18a shown in FIG. 8E may be substituted for the full dicing shown in FIG. 8C.

Figure 9:
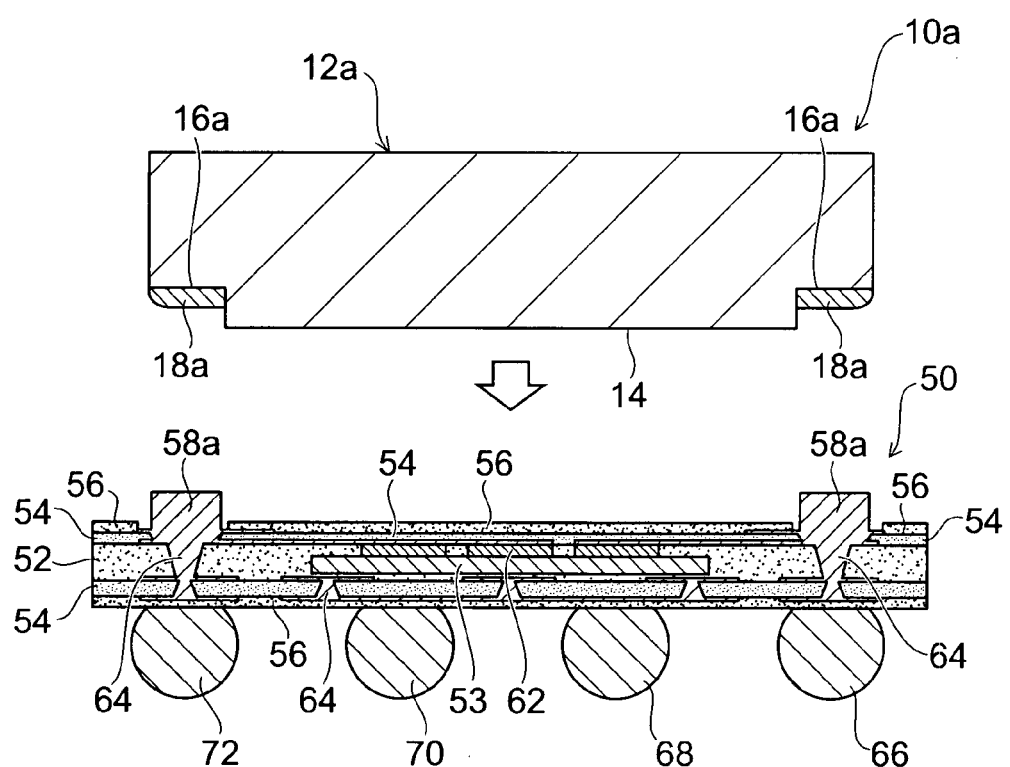
FIG. 9 shows the passive component mounted on the built-in IC substrate in the first embodiment.

When mounting the passive component 10a on the built-in IC substrate 50, the passive component 10a is installed on the surface of the built-in IC substrate 50 which is provided with a pad 58a that corresponds to the concavity 16a of the passive component 10a, as shown in FIG. 9. Then, each terminal electrode 18a and pad 58a are soldered. Thereafter, the space between the mounting surface 14 of the passive component 10a and the surface of the built-in IC substrate 50 is filled with a heat dissipating resin to form the heat dissipating resin layer 60 shown in FIG. 1A.

Since the passive component has a concavity 16a within the mounting surface 14 and the terminal electrode 18a is incorporated within this concavity 16a, the passive component can be mounted low on the substrate surface even when the terminal protrudes from the built-in IC substrate 50. Since the terminal electrode 18a is incorporated in the concavity 16a, solder is prevented from spreading fillet-like at the periphery of the inductor, thus reducing the mounting surface area of the passive component 10a. Moreover, a low profile is realized since the passive component 10a is mounted on a built-in IC substrate 50 in which an IC 53 is embedded within the substrate, and universality and expandability are realized due to the greater freedom in mounting the passive component. As a result, the low profile and high density of passive components ensures universality and expandability.

According to the present embodiment, the terminal electrodes 18a of the passive component 10a are provided so as to enter the inner side in at least two axial dimensions within the three axial dimensions of length, width, and height mutually crossing the inductor 12a, that is, the terminal electrodes 18a are provided at the ends of the inductor 12a to ensure as far as possible the maximum space for the inductor 12a in the minimum dimensions.

Since channel like concavities 16a are provided on two sides facing the rectangular mounting surface 14 in the present embodiment, the concavities 16a of several passive components 10a can be easily formed by a single dicing in the manufacturing process shown in FIGS. 8A-8E, thus improving mass production efficiency.

According to the present embodiment, the passive component 10a and built-in IC substrate 50 can be securely bonded, thus improving the strength of the electronic component module 100a because the pad 58a, which act as the extractor electrodes of the IC 53 to the substrate surface, project from the surface of the built-in IC substrate 50 at positions corresponding to the concavity 16a of the passive component 10a, such that the pad 58a of the built-in IC substrate can be directly connected to the terminal electrode 18a of the passive component 10a. Furthermore, the wiring distance can be shortened such that noise is reduced and power efficiency is improved by electrically connecting the pad and the terminal electrode of the passive component directly rather than through another passive component, and electrically connecting the terminal electrode and the extractor electrode on the normal line of the substrate surface as shown in the figure.

According to the present embodiment, electronic component module 100a realizes an even lower profile because at least a part of the mounting surface 14 of the passive component 10a, other than the concavity 16a, and a part of the substrate surface of the built-in IC substrate 50 are in contact, and heat dissipating characteristics are improved because the heat generated by the IC 53 of the built-in IC substrate 50 escapes to the passive component 10a. It is even more desirable to improve heat dissipating characteristics further by having the entire surface of the mounting surface 14 at parts other than the concavities 16a in contact.

Heat dissipating characteristics are further improved in the present embodiment by providing the heat dissipating resin layer 60 on the upper most surface layer of the substrate surface of the built-in IC substrate 50. Moreover, stress is relieves by the contact of the heat-dissipating resin layer 60 with the passive component 10a, thus reducing the load on the terminal electrode 18a and the pad 58a.

In addition, the present embodiment reduces crosstalk caused by the magnetic field generating from the inductor 12a because the terminal electrode 18a is provided at the end of the passive component 10a. Specifically, noise is further reduced by positioning the IC 53 on the inside of the passive component 10a between the pair of terminal electrodes 18a, and it is even more desirable that only a single IC 53 is disposed on the inside of the passive component 10a between the pair of terminal electrodes 18a. Noise is further reduced by the shortened wiring directly connecting the IC 53 and the passive component 10a rather than from the extractor electrode of the IC 53 through the interior region of the passive electrode 10a.

Figure 10:
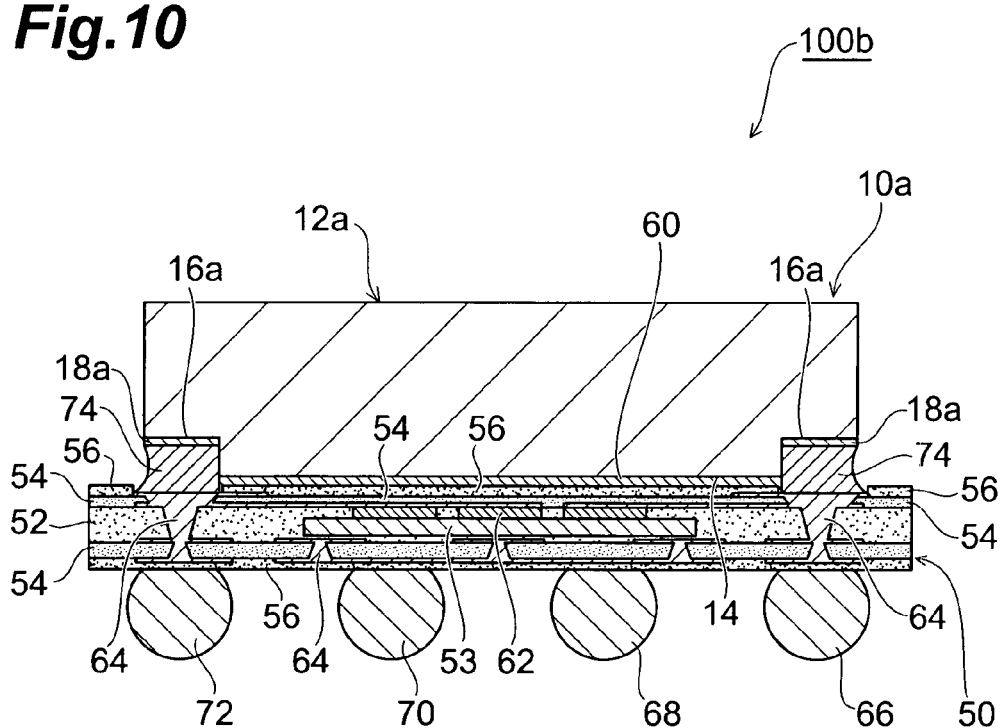
FIG. 10 is a vertical section view showing a second embodiment of an electronic component module.

FIG. 10 is a vertical section view showing a second embodiment of an electronic component module. In the electronic component module 100b of the present embodiment, the terminal electrode 18a is bonded to the via 64 of the built-in IC substrate 50 by solder 74 alone. Mounting is easier in the present embodiment because provision of the pad 58a is unnecessary. However, solder 74 is retained within the concavity 16a, thus preventing fillet-like spreading by the added action of the resist 56. Therefore, low profile and high density are secured, and mounting is even easier.

The connection between the terminal electrode 18a and the extractor electrode of the built-in IC substrate 50 is not specifically limited and may be suitably adjusted by the channel size of the concavity 16a as described above using, for example, a method of connecting through a copper post such as the pad 58a using solder, a method of connecting through a copper post using ultrasonic welding, or a method for connecting directly with solder using a solder paste or solder ball.

Figure 11:
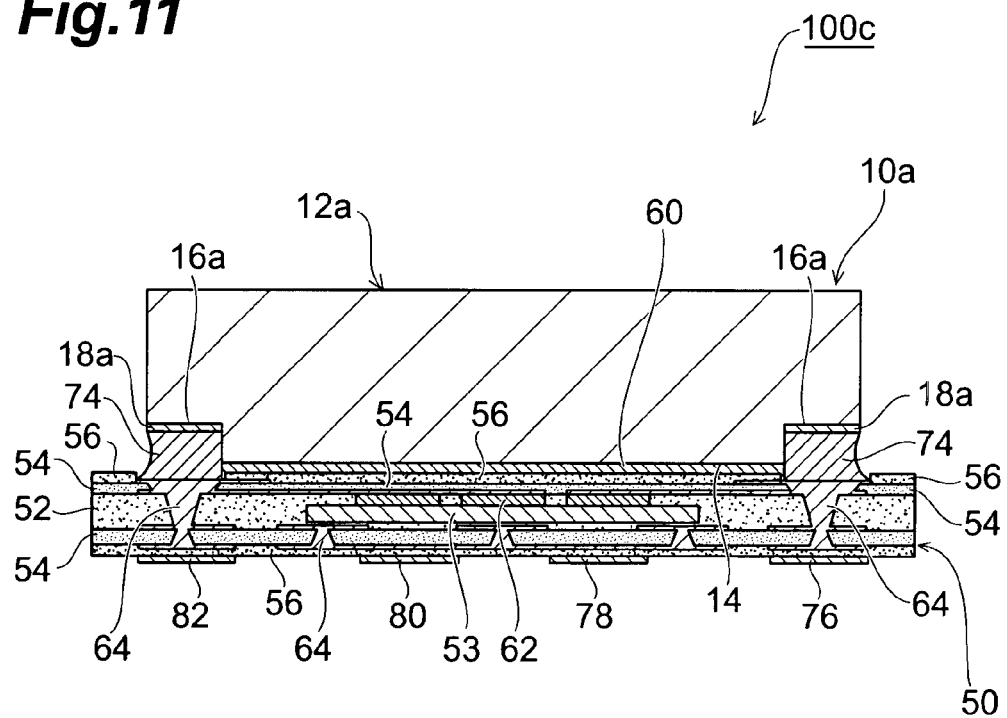
FIG. 11 is a vertical section view showing a third embodiment of the electronic component module.

FIG. 11 is a vertical section view showing a third embodiment of the electronic component module. In the electronic component module 100c of the present embodiment, a $V_{in}$ plate 76, EN plate 78, FB plate 80, and GND plate 82 are substituted for the $V_{in}$ bump 66, EN bump 68, FB bump 70, and GND bump 72 provided on the rear surface of the built-in IC substrate 50 of the second embodiment. A lower profile can be realized for the overall electronic component module 100c of the present embodiment by substituting spherical bumps for the thin plates.

Figure 12:
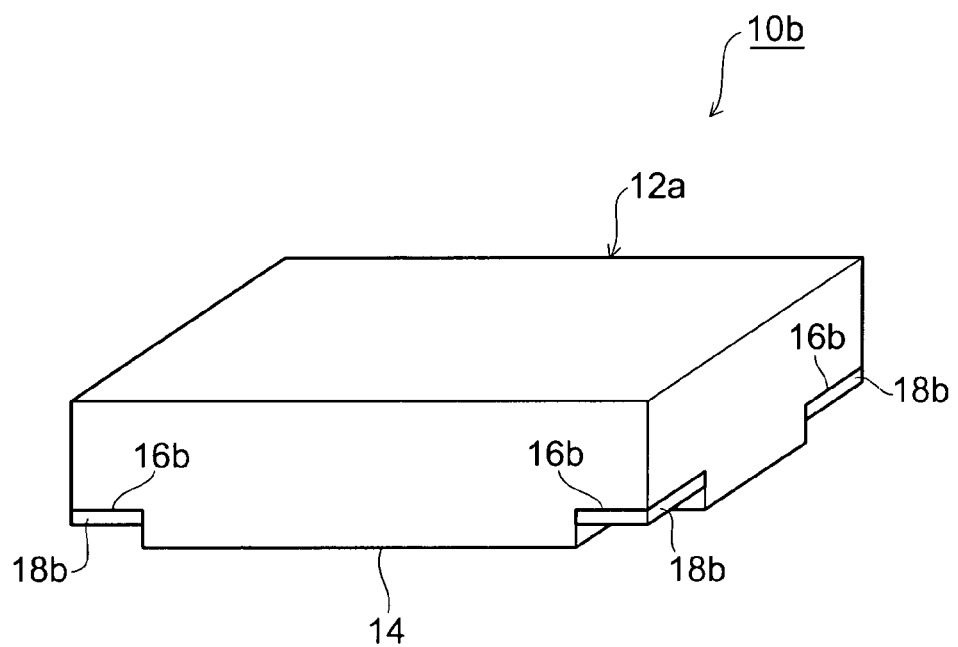
FIG. 12 is a perspective view of the passive component of a fourth embodiment shown from the side.
Figure 13:
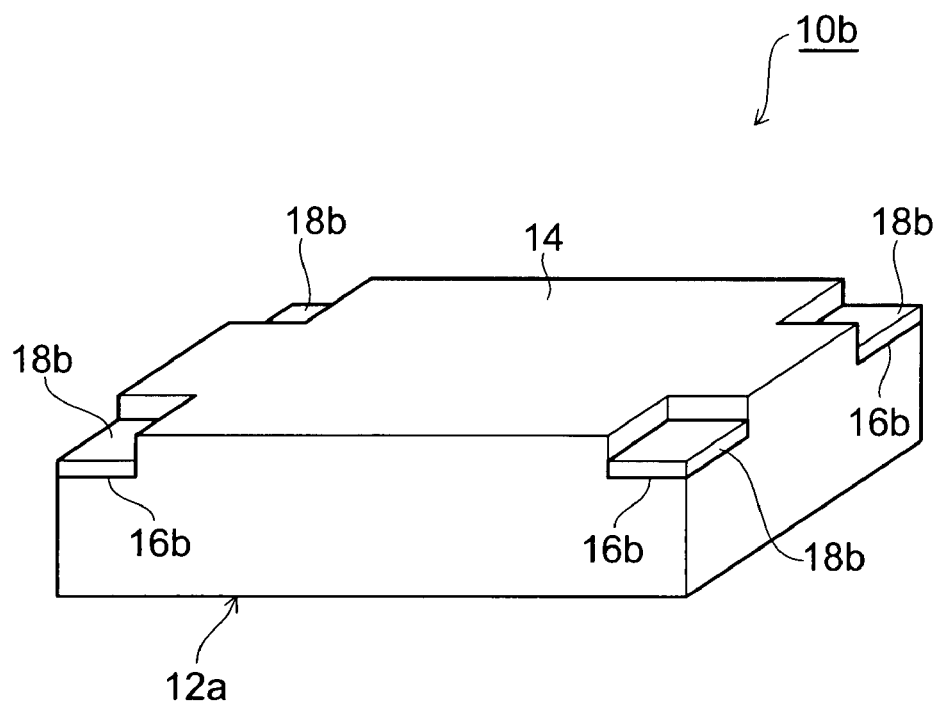
FIG. 13 is a perspective view of the passive component of a fourth embodiment shown from the bottom side.
Figure 14:
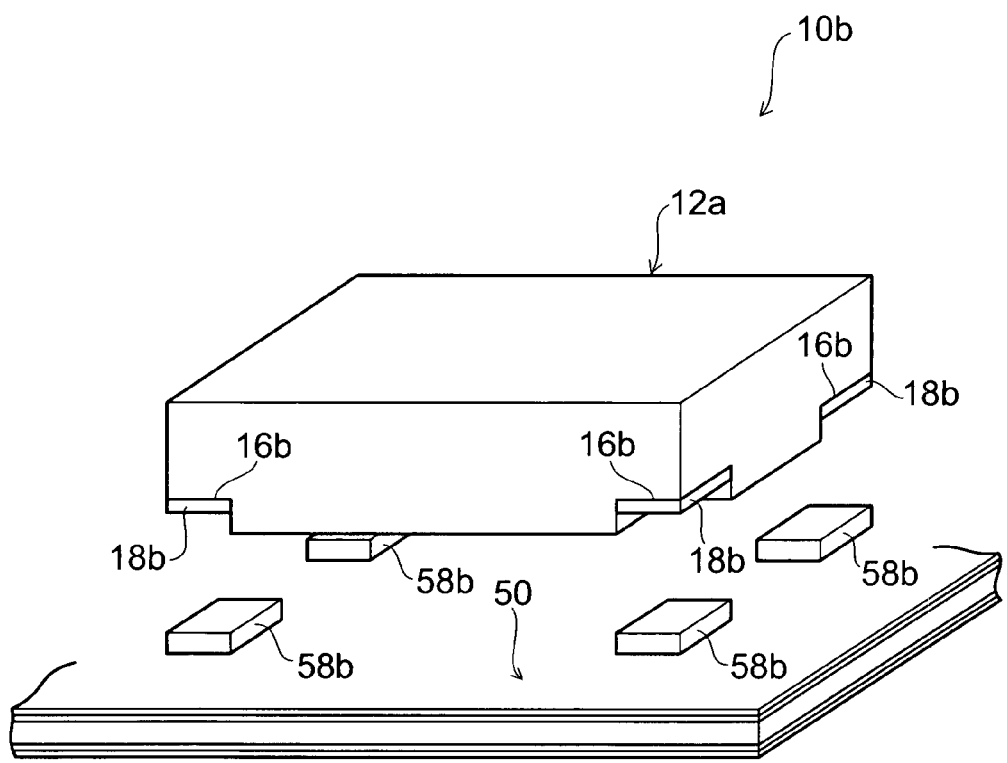
FIG. 14 shows the passive component mounted on the built-in IC substrate in the fourth embodiment.

FIG. 12 is a perspective view showing the passive component of the fourth embodiment from the side, and FIG. 13 is a perspective view of the passive component of the fourth embodiment shown from the bottom side. In the passive component 10b of the present embodiment shown in FIGS. 12 and 13, the concavities 16b, which respectively incorporate a terminal electrode 18b, are provided at the four corners facing the interior of the rectangular mounting surface 14, that is, the concavities 16b form notches on the diagonal. When mounting the passive component 10b on the built-in IC substrate 50, pads 58b are provided on the substrate surface of the built-in IC substrate 50 so as to correspond to the four concavities 16b within the mounting surface 14 of the passive component 10b, after which each pad 58b and terminal electrode 18b are bonded, as shown in FIG. 14. Mounting strength and stability are further improved in the present embodiment by providing the concavity 16b, which incorporates a terminal electrode 18b, at the corners facing the mounting surface 14, and providing the pad 58b on the substrate surface id the built-in IC substrate 50 so as to correspond with the concavity 16b. Furthermore, positioning is simple when mounting.

Figure 15:
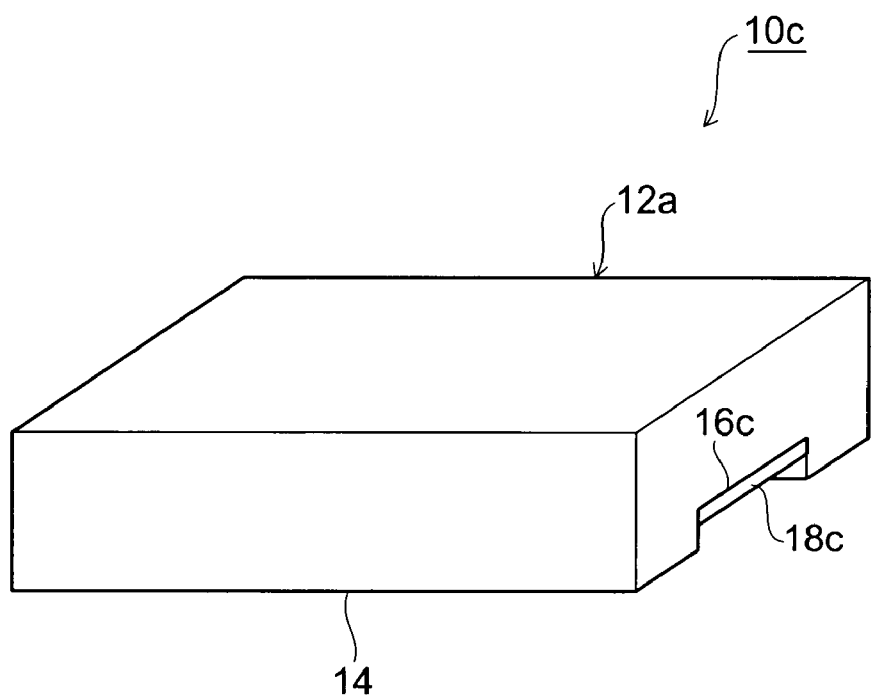
FIG. 15 is a perspective view of the passive component of a fifth embodiment shown from the side.
Figure 16:
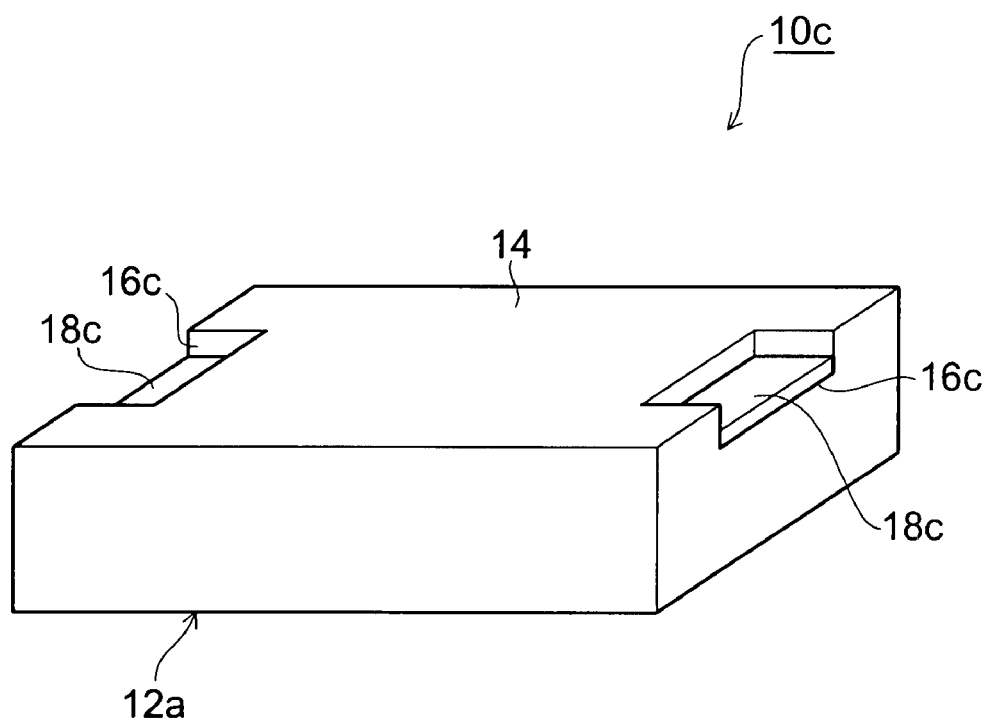
FIG. 16 is a perspective view of the passive component of a fifth embodiment shown from the bottom side.

FIG. 15 is a perspective view showing the passive component of the fifth embodiment from the side, and FIG. 16 is a perspective view of the passive component of the fifth embodiment shown from the bottom side. In the passive component 10c of the present embodiment shown in FIGS. 15 and 16, a concavity 16c that incorporates a terminal electrode 18c is respectively provided on sides facing the rectangular mounting surface 14. Mounting strength and stability are further improved when mounting the passive component 10*c* on the substrate in this case also.

Figure 17:
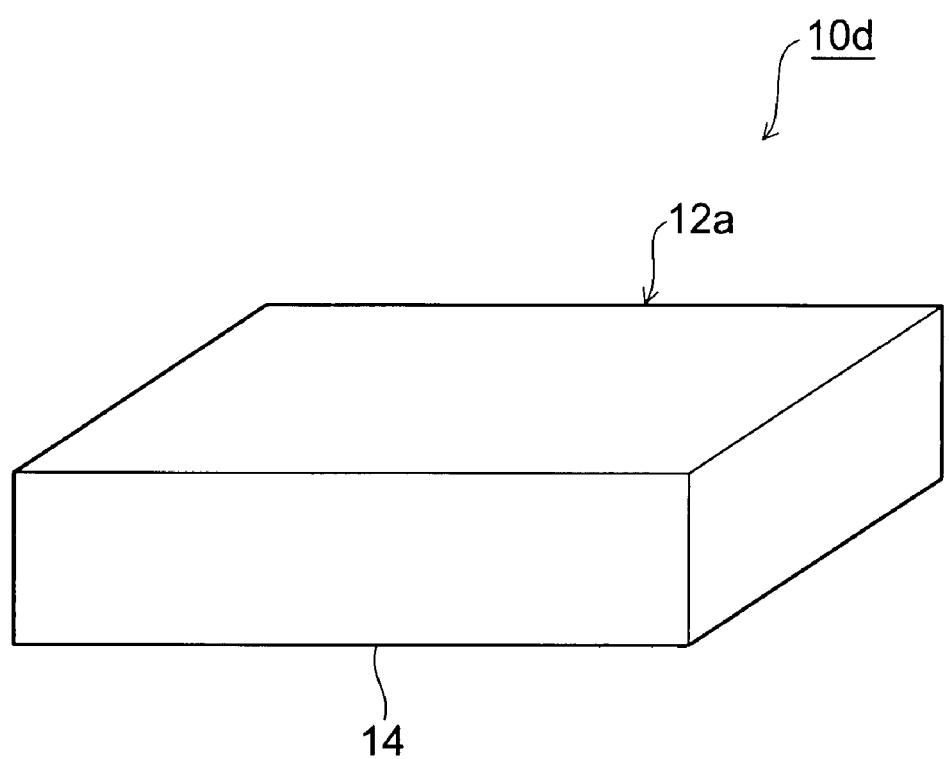
FIG. 17 is a perspective view of the passive component of a sixth embodiment shown from the side.
Figure 18:
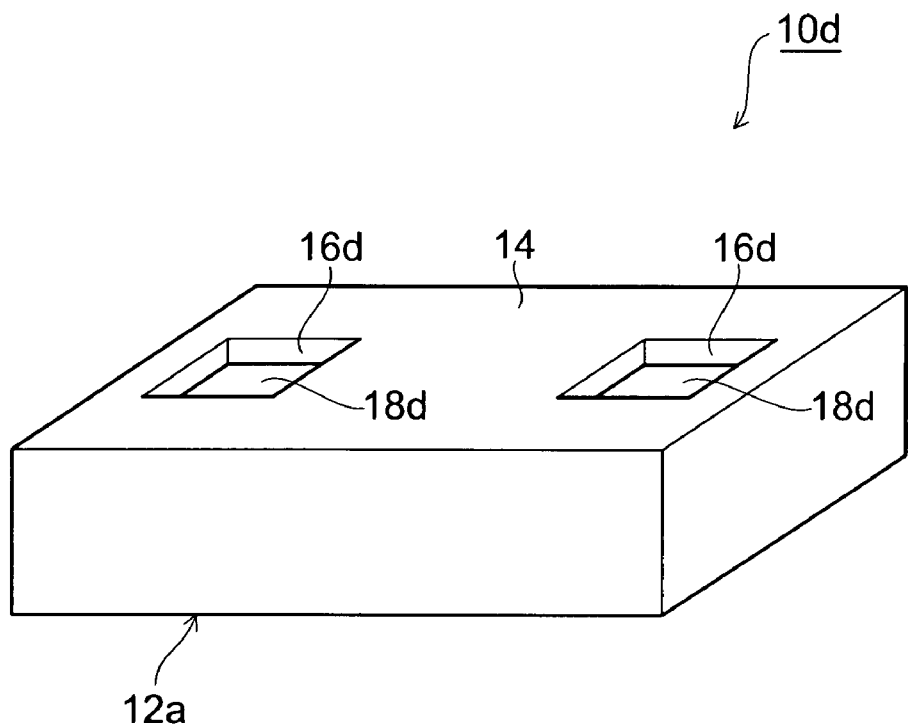
FIG. 18 is a perspective view of the passive component of the sixth embodiment shown from the bottom side.

FIG. 17 is a perspective view showing the passive component of the sixth embodiment from the side, and FIG. 18 is a perspective view of the passive component of the sixth embodiment shown from the bottom side. In the margin mounting surface 14 of the present embodiment shown in FIGS. 17 and 18, concavities 16*d* that incorporate a terminal electrode 18*d* are provided in the interior and not in the margin of the mounting surface 14. The concavity 16*d* can be formed at this location by abrading the mounting surface 14 using a drill or the like.

Figure 19:
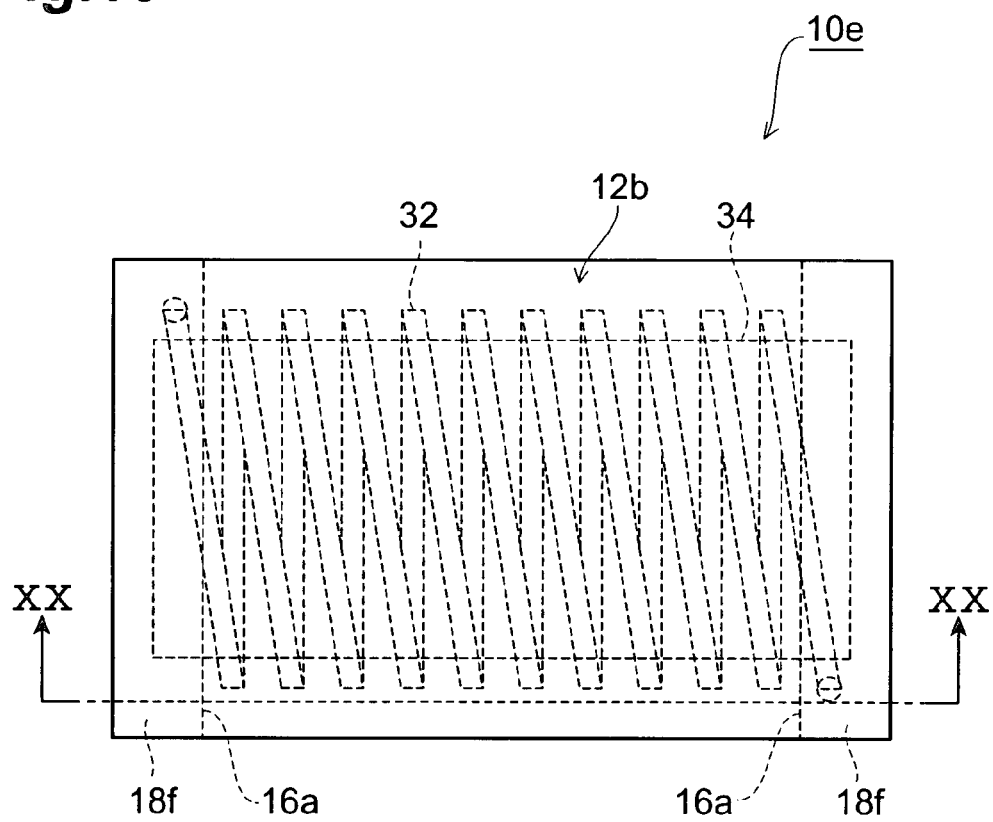
FIG. 19 is a top view showing the internal structure of a seventh embodiment of the passive component.

FIG. 19 is a top view showing the internal structure of a seventh embodiment of the passive component. As shown in FIG. 19, the passive component 10*e* of the present embodiment is provided with a wound type of inductor as the inductor 12*b*. In this embodiment, a solenoid winding 32 is wound on a ferrite core 34, the length of which is disposed parallel to the mounting surface 14. The inductor characteristics are excellent in this embodiment.

Figure 20:
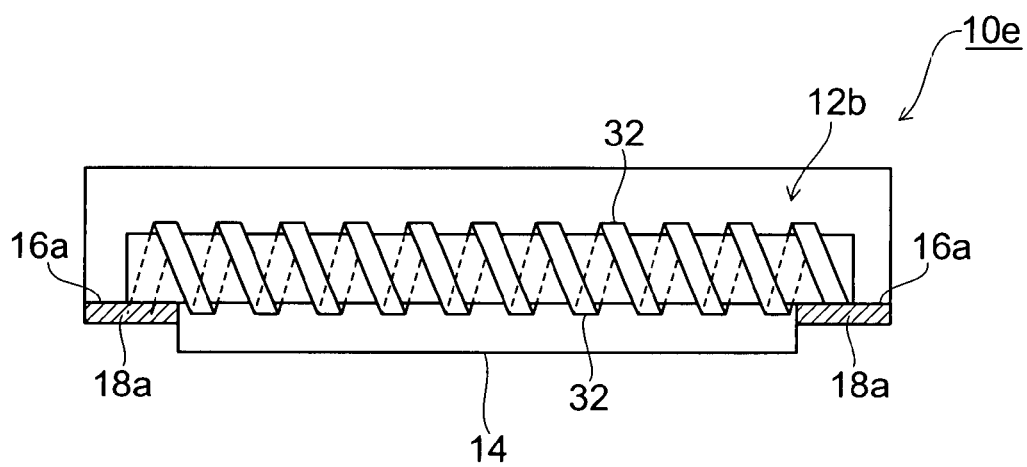
FIG. 20 is a vertical section view showing a seventh embodiment of the passive component.

FIG. 20 is a vertical section view showing a seventh embodiment of the passive component and shows the section by the XX line in FIG. 19. As shown in FIG. 20, the inductor 12*b* can be realized in minimum dimensions relative to volume by the exclusive occupancy of the solenoid winding 32 of the inductor 12*b* in any part other than the part of the passive component 10*e* on the mounting surface 14 side that includes the concavities 16*a*.

Figure 21:
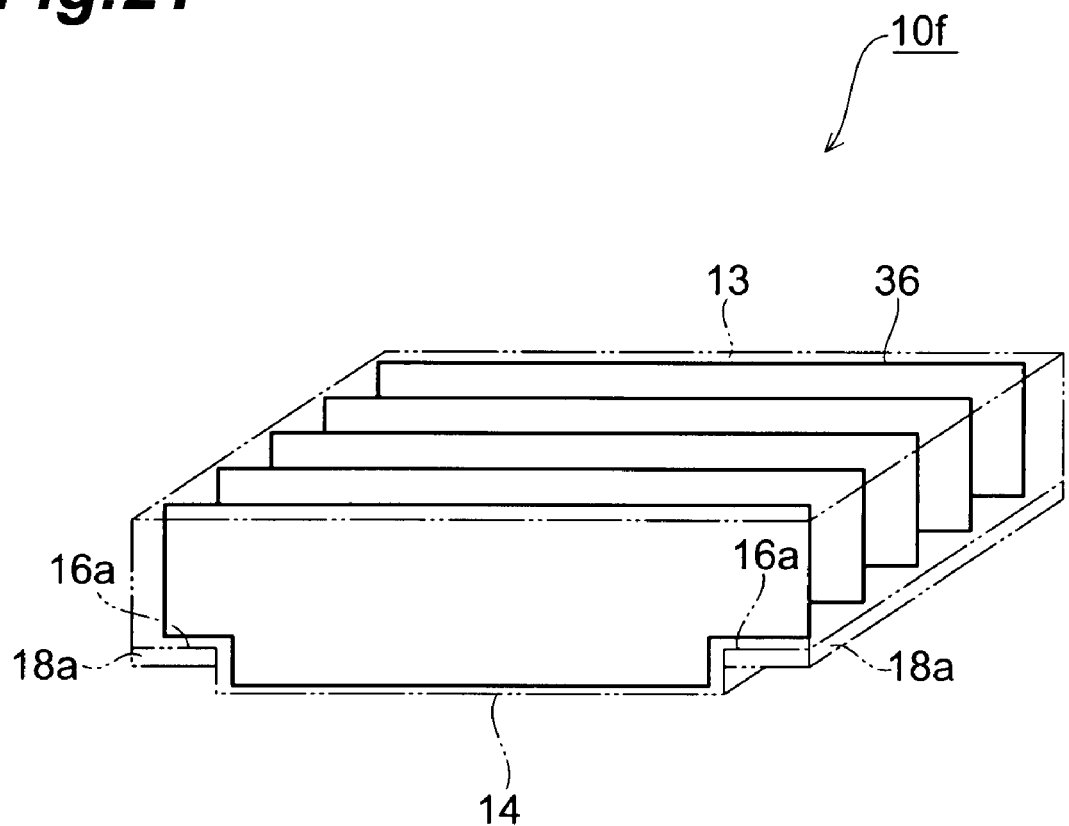
FIG. 21 is a see-through perspective view showing the internal structure of an eighth embodiment of the passive component.

FIG. 21 is a see-through perspective view showing the internal structure of an eighth embodiment of the passive component. The passive component 10*f* of the present embodiment shown in FIG. 21 is provided with a capacitor 13 as a passive element, and has a plurality of capacitor electrodes 36 disposed in parallel within the capacitor 13. The capacitor electrodes 36 are arranged perpendicular to the mounting surface 14, and the capacitor electrodes 36 can easily be electrically connected on the mounting surface 14 side.

Figure 22:
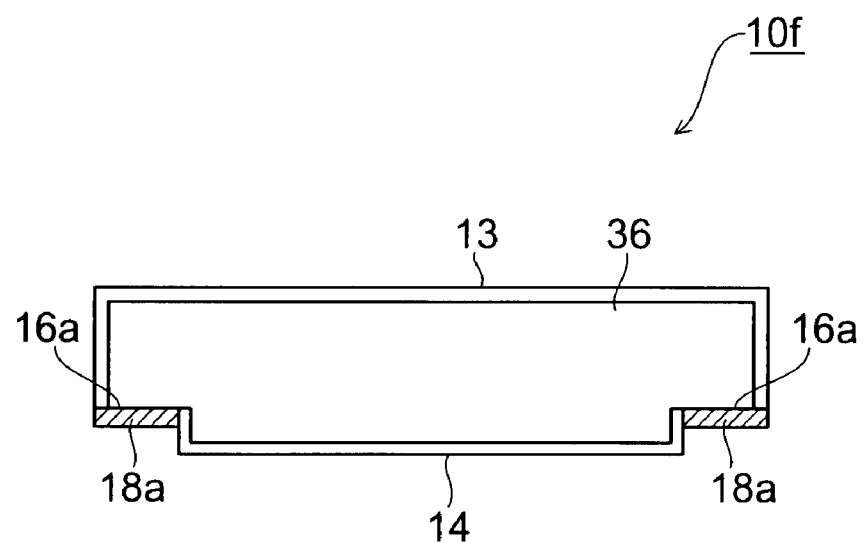
FIG. 22 is a vertical section view showing an eighth embodiment of the passive component.

FIG. 22 is a vertical section view showing an eighth embodiment of the passive component. As shown in FIG. 22, the capacitor 13 can be realized in minimum dimensions relative to volume by the exclusive occupancy of the capacitor electrodes 36 of the capacitor 13 in any part other than the part of the passive component 10*f* on the mounting surface 14 side that includes the concavities 16*a* since the capacitor electrodes 36 are formed to correspond to the concavities 16*a*.

Figure 23A:
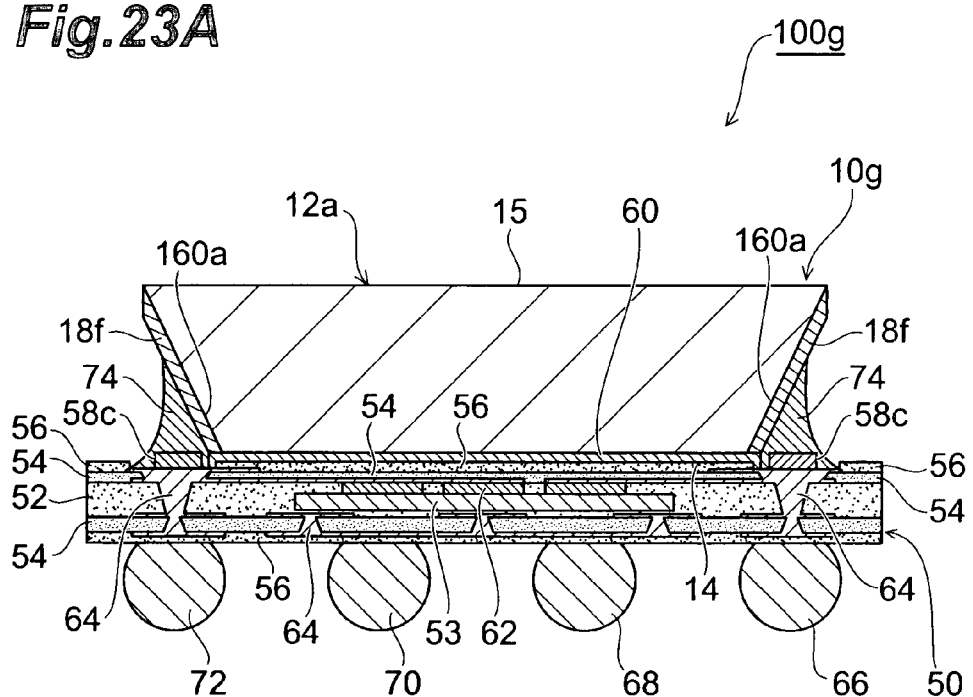
FIG. 23A is a vertical section view showing a ninth embodiment of an electronic component module.

FIG. 23A is a vertical section view showing a ninth embodiment of an electronic component module. As shown in FIG. 23A, the electronic component module 100*g* of the present embodiment is configured by a passive component 10*g*, which is described later, mounted on a built-in IC substrate 50, and provides the function, for example, of a DC-DC converter or the like in a power circuit of a portable telephone. In this instance, one terminal electrode 18*f* of the passive component 10*g* provides the function of an SW terminal for supplying a switching voltage, and another terminal electrode 18*f* provides the function of an output terminal $V_{out}$. The typical circuit diagram of the DC-DC converter is shown in FIG. 1B.

The built-in IC substrate 50 has an IC 53 embedded therein that provides the function of a switching circuit or the like within a support substrate 52. A resin layer 54 and resist 56 are sequentially laminated on the rear surface of the support substrate 52. Furthermore, a pad 58*c* projects from the surface of the built-in IC substrate 50 to form the extractor electrode of the IC 53 at a position corresponding to the terminal electrode 18*f* provided on a side surface 160*a* the passive component 10*g*. The pad 58*c* is formed within the projection plane when the passive component 10*g* is projected on the surface of the built-in IC substrate 50. The IC 53 is positioned on the inner side of the passive component 10*g* between the pair of terminal electrodes 18*f*. From the perspective of noise reduction, it is desirable that only a single IC 53 is disposed on the inner side of the passive component 10*g* between the pair of terminal electrodes 18*f*. The pad 58*c* and the concavity 16*a* of the passive component 10*a* can be connected by solder or the like and the pad 58*c* and the concavity 16*a* of the passive component 10*a* need not necessarily be disposed so as to be precisely fitted. Mounting is facilitated and stress when bonded can be relieved by setting a predetermined amount of mutual play.

Figure 23B:
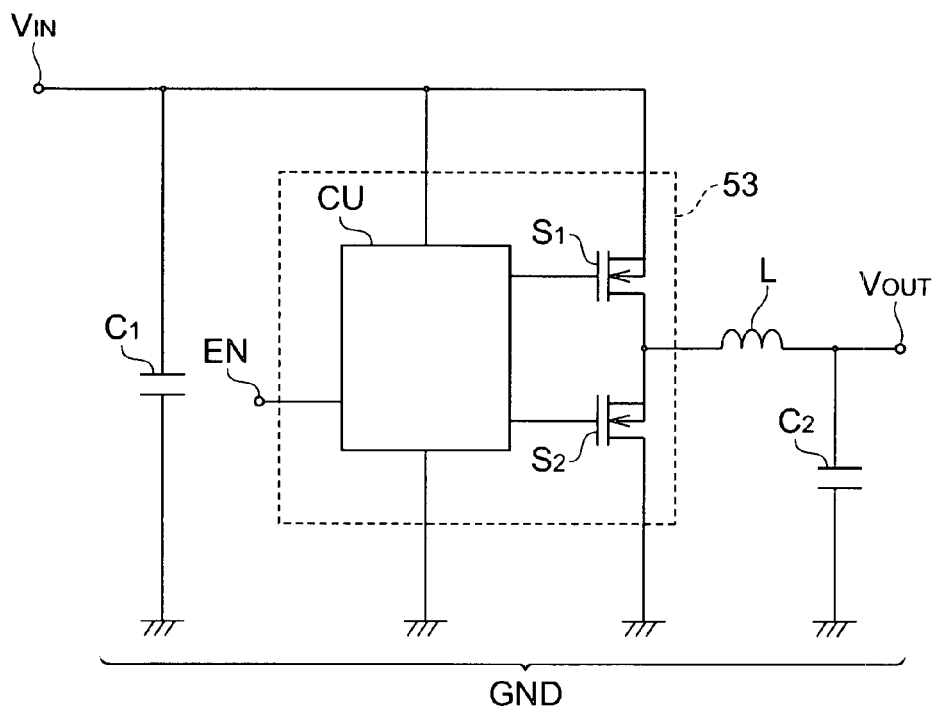
FIG. 23B is a typical circuit diagram of a DC-DC converter composed by the electronic component module.

A via 64 is formed so as to pass through the front and rear surfaces of the substrate at parts of the built-in IC substrate 50 including directly below the pad 58*c*, and the passive component 10*g* and the IC 53 are electrically connected through an IC bump 62 of the IC 53. Thus, the IC 53 and the passive component 10*g* are directly connected from the extractor electrode of the IC 53 and not through the inner region of the IC 53. Furthermore, the via 64 electrically connects the rear surface $V_{in}$ (voltage input terminal) bump 66 of the built-in IC substrate 50, the EN (enable terminal) bump 68, the FB (voltage feedback terminal) bump 70, and GND (ground terminal) bump 72 of the built-in IC substrate 50. Thus, by connecting the passive component 10*g* directly with the wiring pulled out electrically from IC 53 via Pad 58*c*, it can arrange distance between IC 53 and inductor L on the circuit diagram shown in FIG. 23B at the shortest, high integration is not only expectable, but high efficiency can attain as a DC-DC converter.

A heat dissipating resin layer 60 (underfill) is formed on the outermost layer, and the mounting surface 14 of the passive component 10*g* is in contact with the surface of the built-in IC substrate 50 through this heat dissipating resin layer 60. Heat from IC can be efficiently radiated because the mounting surface 14 is in contact directly.

Figure 24A:
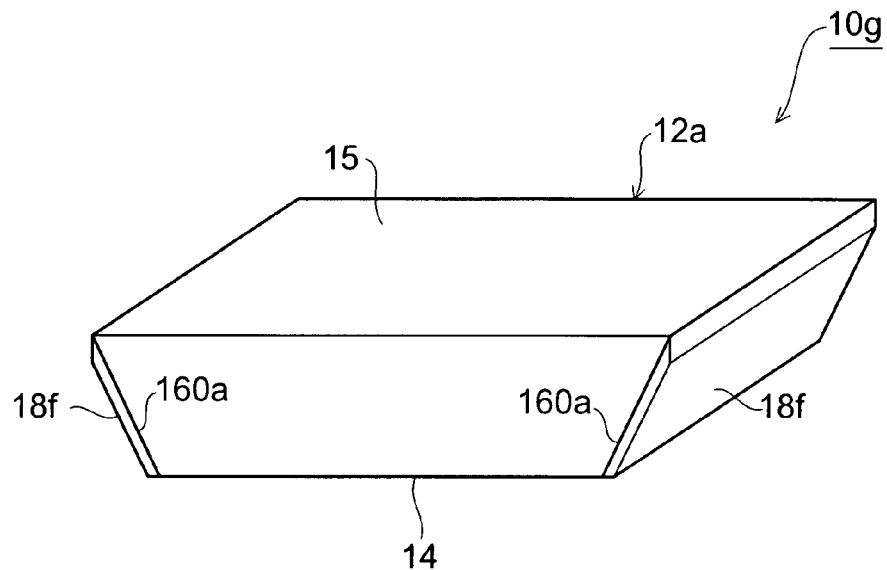
FIG. 24A through 24B are perspective views of the passive component of a ninth embodiment shown from the side.
Figure 24B:
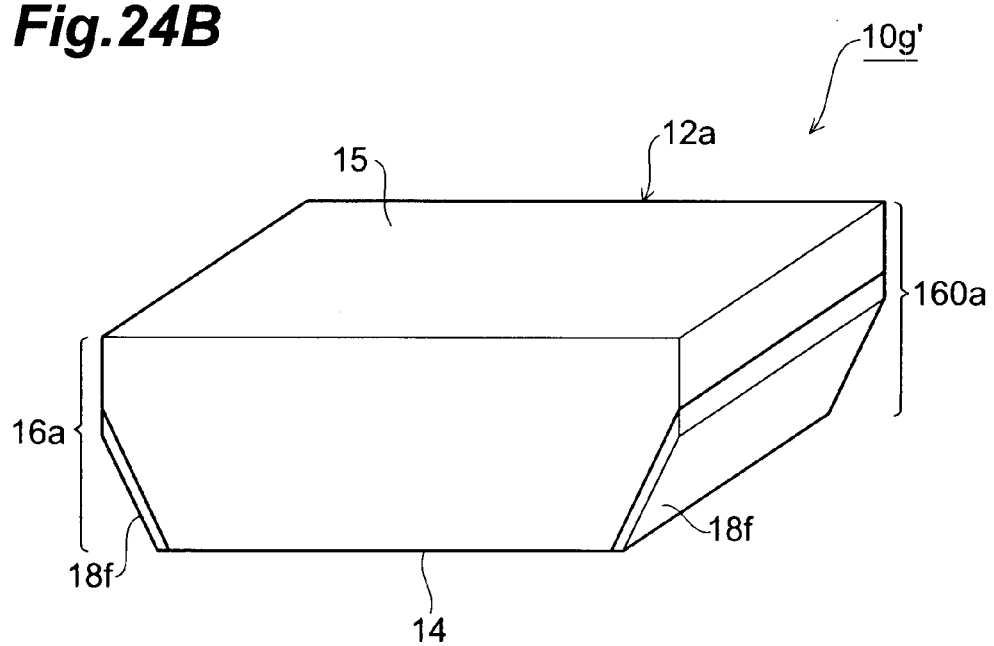
Figure 25A:
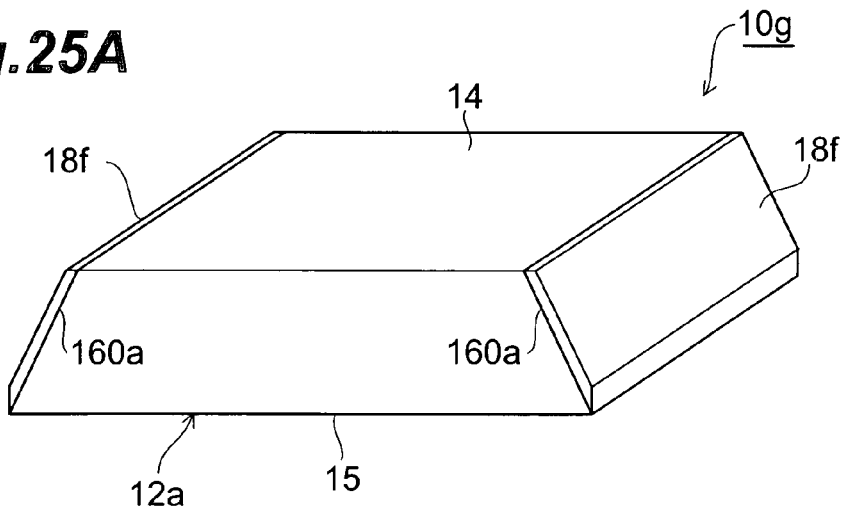
FIG. 25A through 25C are perspective views of the passive component of the ninth embodiment shown from the bottom side.
Figure 25B:
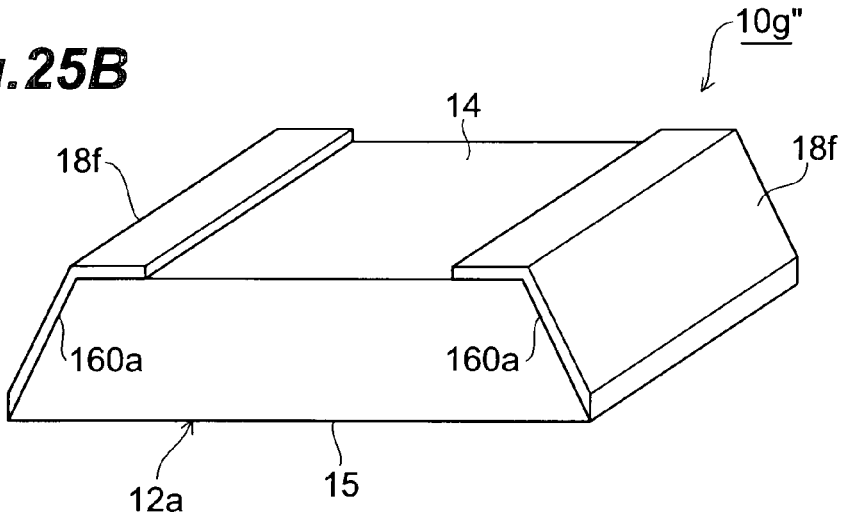
Figure 25C:
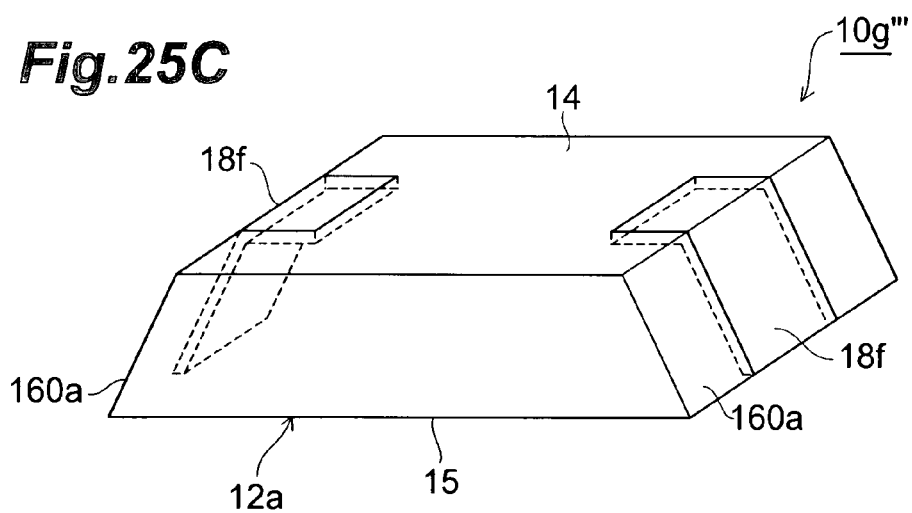

FIGS. 24A-24B are perspective views showing the passive component of the ninth embodiment from the side, and FIGS. 25A-25C are perspective views of the passive component of the ninth embodiment shown from the bottom side. As shown in FIGS. 24A-24B and 25A-25C, in total the passive component 10*g*, 10*g'*, 10*g"*, 10*g'''* has a flat plate configuration 1.5 to 3.5 mm long, 1.0 to 3.0 mm wide, and not more than 1.0 mm high, and is provided with an inductor 12*a*, a mounting surface 14 for mounting on the built-in IC substrate 50, an opposed surface 15 facing the mounting surface 14, and a pair of side surfaces 160*a* that intersect the mounting surface 14 and the opposed surface 15. Although the overall configuration of the passive component 10*g*-10*g'''* may be other than flat plate-like, such as cylindrical, polygonal or the like, as low a height as possible from the mounting surface 14 is desirable from the standpoint of a low profile when mounting on the built-in IC substrate 50. As shown in FIGS. 24A-24B, 25A-25C, and 29, the side surface 160*a* has a cross section configuration in which the cross section is perpendicular to the opposed surface 15 and the mounting surface 14 of the inductor 12*a*, and inclines so as to spread at least partly from the mounting surface 14 toward the opposed surface 15 side. Thus, cross section configuration in which the cross section is perpendicular to the opposed surface 15 and the mounting surface 14 of the inductor 12*a*, is, for example, a trapezoidal shape with a bottom of approximately 2.3 mm, top of approximately 2.5 mm, and height of approximately 0.8 mm. A terminal electrode 18*f* is provided on the opposed side surfaces 160*a*. The terminal electrode 18*f* need not be provided on the entirety of the side surface 160*a* inasmuch as the terminal electrode 18f may be provided on a part thereof. The terminal electrode 18f may cover the mounting surface 14. The terminal electrode is prolonged to the mounting surface (FIG. 25B) and junction intensity with a substrate can be raised more. Although the terminal electrodes 18f are provided on the side surface 160a in FIG. 24A, they 18f can be embedded with the form buried in the side surface 160a (FIG. 25C). By making it such a form, the junction intensity at the time of mounting can be improved simultaneously and fillet width can be reduced.

The variation of FIG. 24A is shown in FIG. 24B. The whole side surface 160a does not need to incline in a skirt spread and only the part may incline so that clearly from FIG. 24B. The side surface 160a has two or more planes from the mounting side 14 toward the opposed surface 15 side in the section which intersects perpendicularly with the mounting surface 14 and the opposed surface 15 of passive component 10g', and only the mounting surface may incline.

Furthermore, you may form terminal electrodes 18f only in the slope in the side surface 160a. In such a case, in junction to the substrate by solder, there is no possibility that solder is damp and may spread to the opposed surface 15 concerned (FIG. 30E), contact or the like between adjoining parts can be prevented, and it can be provided as a more reliable module.

Figure 26:
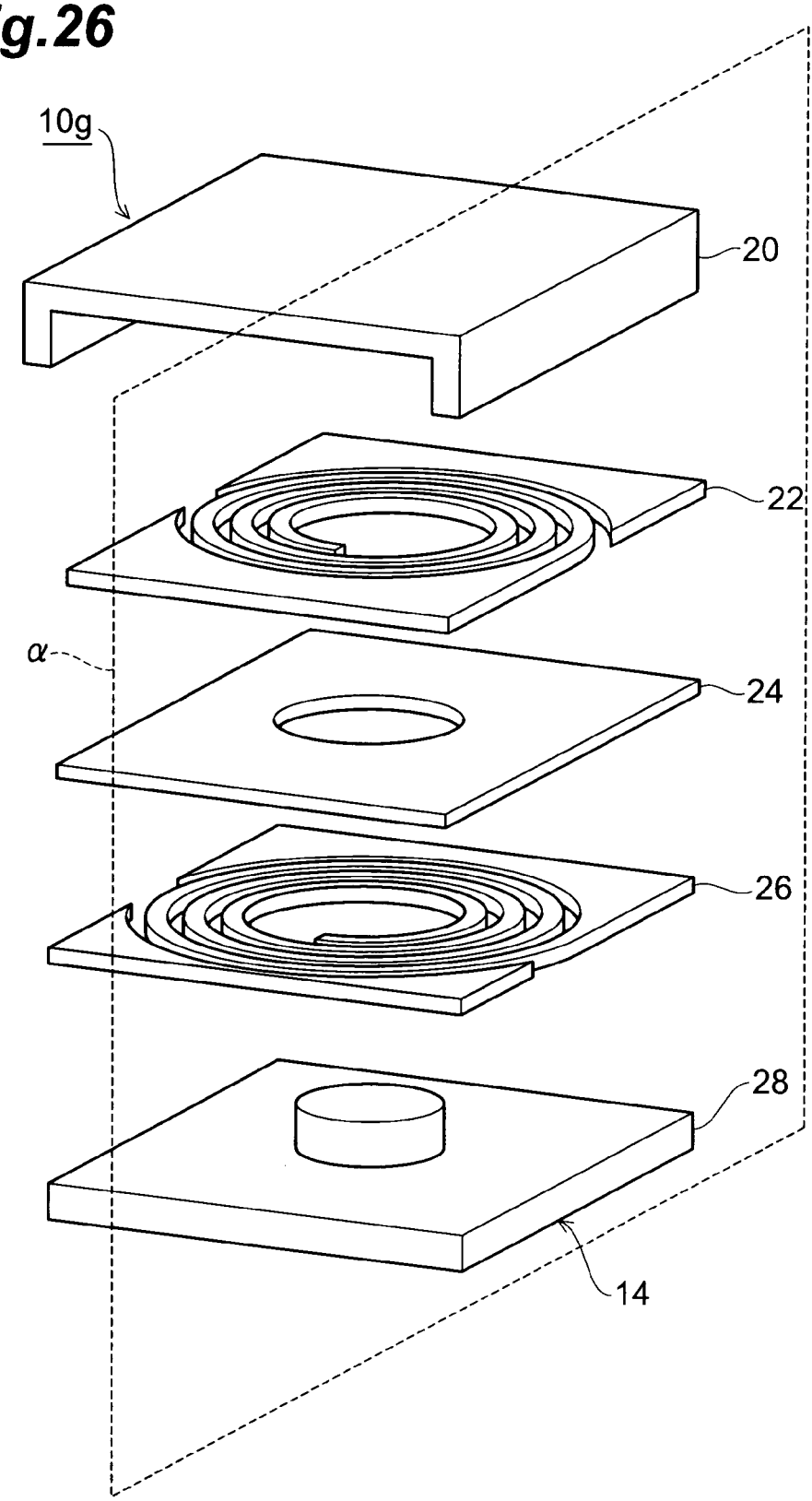
FIG. 26 is an exploded perspective view showing the internal structure of a ninth embodiment of the passive component.

FIG. 26 is an exploded perspective view showing the internal structure of a ninth embodiment of the passive component. As shown in FIG. 26, before the side surfaces 160a and terminal electrodes 18f are formed, the passive component 10g is configured by laminations of an top ferrite core 20, top winding 22, printed board 24, bottom winding 26, and bottom ferrite core 28. The top winding 22 and bottom winding 26 are respectively formed on the front and rear surface of the printed board 24 with the printed board 24 sandwiched therebetween, and are electrically connected. A large current can flow compared to a laminate type inductor, and a lower profile can be obtained compared to a wound type inductor by interposing the top winding 22, printed board 24, and bottom winding 26 between the top ferrite core 20 and the bottom ferrite core 28.

Figure 27:
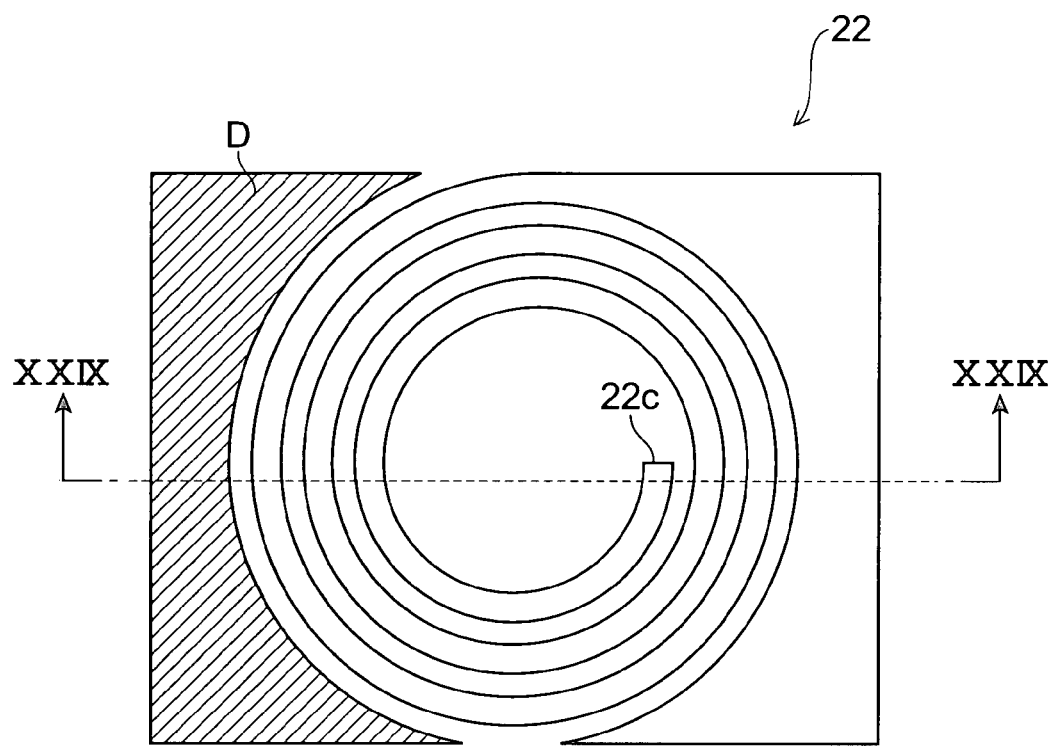
FIG. 27 is a top view of the upper winding.
Figure 28:
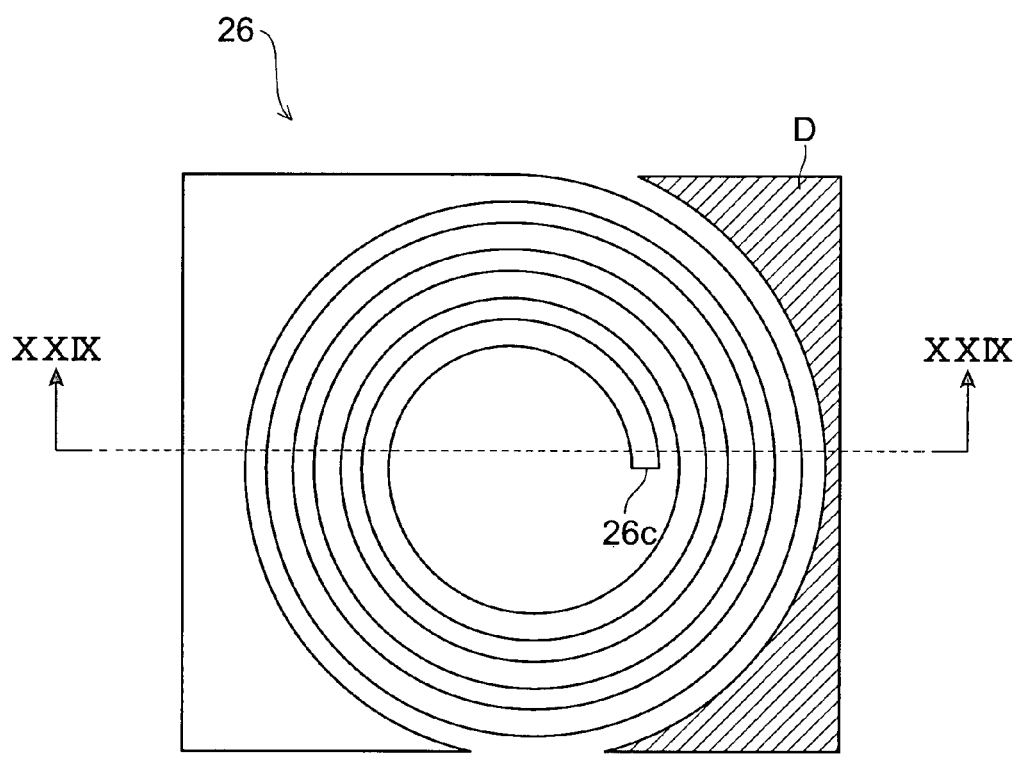
FIG. 28 is a top view of the lower winding.

FIGS. 27 and 28 are top view of the top winding 22 and the bottom winding 26, respectively. As shown in FIGS. 27 and 28, the top winding 22 and the bottom winding 26 spiral in respectively opposite directions. The top winding end 22c of the top winding 22 and the bottom winding end 26c of the bottom winding 26 have nearly identical horizontal positions when the top winding 22 and the bottom winding 26 are mutually superimposed on another. The portion of the dummy D of top winding 22 and bottom winding 26 is not connected electrically with the portion of top winding 22 and bottom winding 26 which serves as winding. Because there is such a dummy D, a contact surface with solder can increase and the junction intensity at the time of mounting can be improved.

Figure 29:
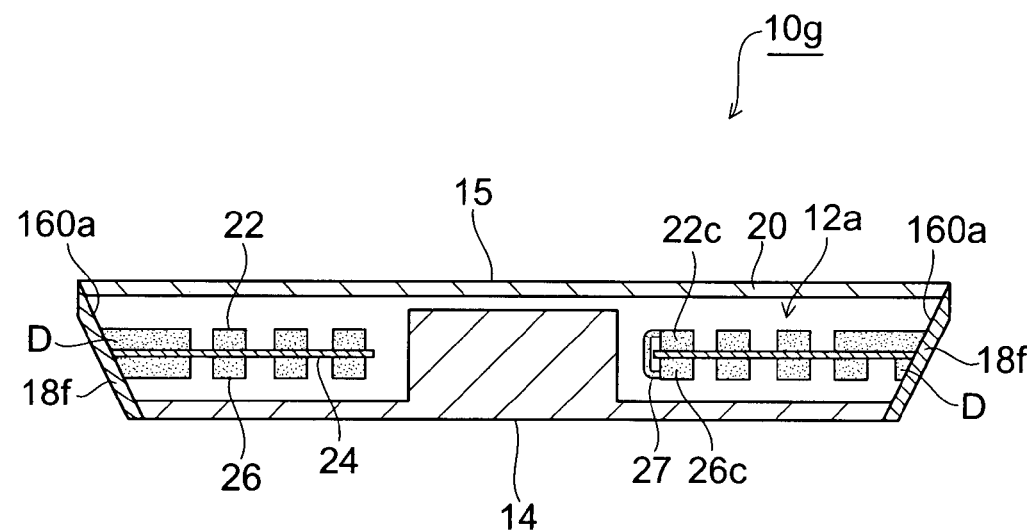
FIG. 29 is a vertical section view showing the ninth embodiment of the passive component.

FIG. 29 is a vertical section view showing the passive component of the ninth embodiment and shows the section by the a surface in FIG. 26, and the section by the XXIX line in FIGS. 27-28. Since the terminal electrode 18f is actually mounted after laminating the top ferrite core 20 and the like as described later, whatever the part of the passive component 10g, the part is exclusively occupied by the top winding 22 and bottom winding 26 and the like of the inductor 12a, such that the inductor 12a can have minimum dimensions relative to volume as shown in FIG. 29. The top winding end 22c of the top winding 22 and the bottom winding end 26c of the bottom winding 26 are electrically connected by a winding joint 27.

Although the plane type spiral coil is used with this embodiment, this invention is not limited to the plane type spiral coil and the solenoid type coil which the direction of that coil becomes parallel to a mounting surface may be sufficient. The plane type spiral coil is advantageous when mounting in the point that the thickness on a substrate becomes the minimum more.

Although ferrite cores are used in the present embodiment, the magnetic material is not specifically limited to a ferrite core inasmuch as various materials may be used including magnetic metal materials, oxides of magnetic materials. Moreover, the printed board is not particularly problematic insofar as an insulating material is used; resin substrates and insulating ceramic substrates are widely usable.

Figure 30A:
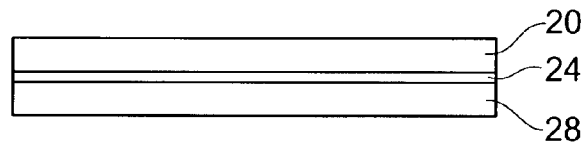
FIG. 30A through 30E show the manufacturing process of the passive component.

FIGS. 30A-30E show the passive component manufacturing process. The process which manufactures passive component 10g' shown in FIG. 24B as an example is shown hereafter. When manufacturing the passive component 10g' of the present embodiment, the top ferrite core 20, printed board 24 on which the windings are formed on front and rear surfaces, and the bottom ferrite core 28 are laminated to form a long plate-like body, as shown in FIG. 30A.

Figure 30B:
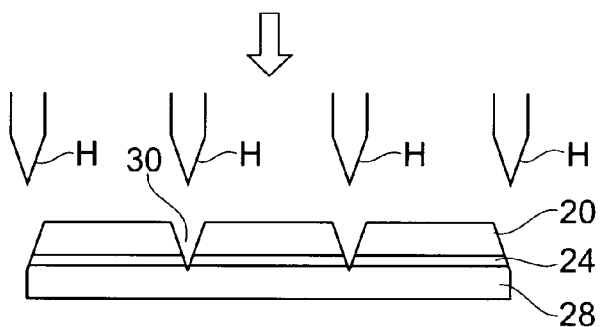

As shown in FIG. 30B, dicing is not performed to a depth that completely and mutually separates the plate-like body, rather half dicing is performed to reach the printed board 24 by a wide width dicer H. This half dicing forms half diced parts 30 that have a V-shaped cross section in the plate-like body, thus exposing the conductive metal of the interior area to form the side surfaces of the passive element.

Figure 30C:
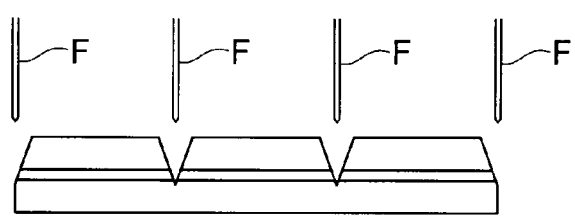
Figure 30D:
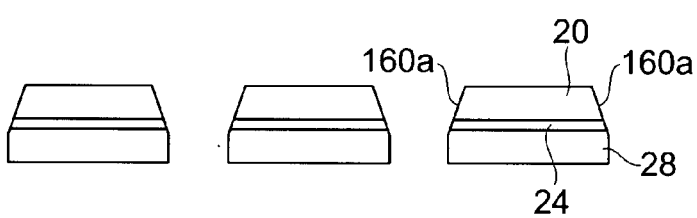

As shown in FIG. 30C, a narrow width dicer F is used to perform full dicing of the half diced parts 30 to a depth that completely separates the plate like body. This full dicing separates the plate-like body in the size of individual passive elements. and forms the side surfaces 160a, as shown in FIG. 30D.

Figure 30E:
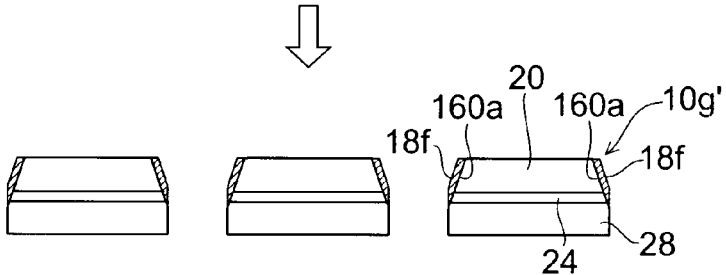

As shown in FIG. 30E, the passive component 10g' can be manufactured by forming terminal electrodes 18f on the side surfaces 160a. Furthermore, the sequence of the formation of the terminal electrode 18f shown in FIG. 30E may be substituted for the full dicing shown in FIG. 30C.

Figure 31:
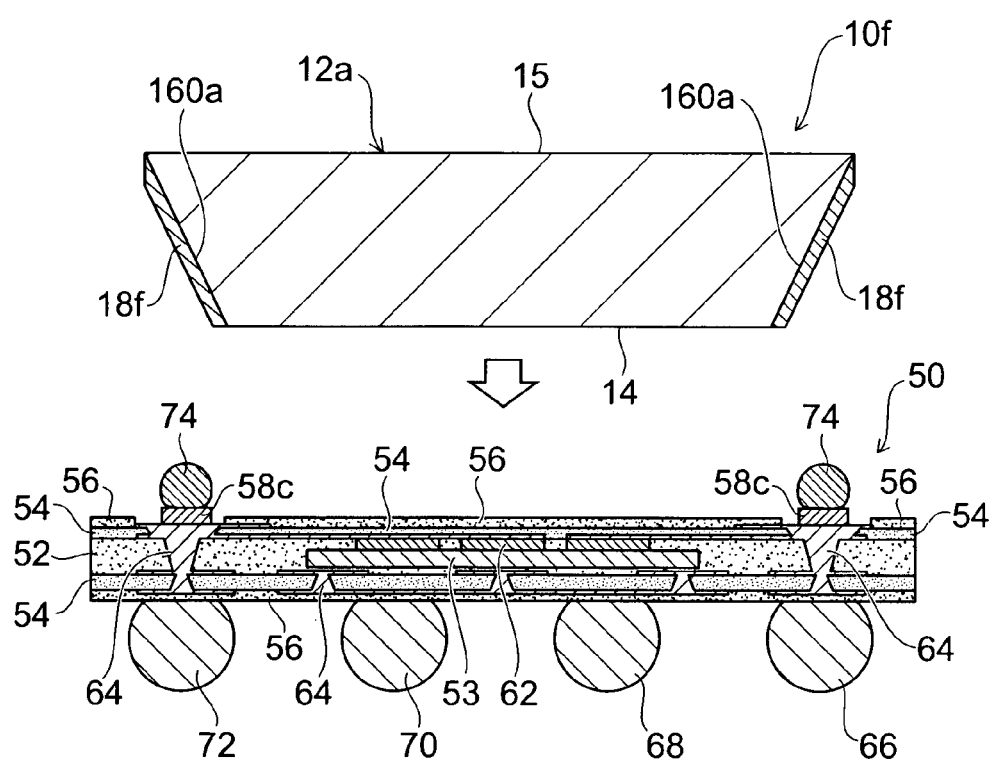
FIG. 31 shows the passive component mounted on the built-in IC substrate in the ninth embodiment.

When the passive component 10g' is mounted on the built-in IC substrate 50, the passive component 10g is disposed on the surface of the built-in IC substrate 50 provided with pads 58c that correspond to the side surfaces 160a of the passive component 10g, as shown in FIG. 31. Then, each terminal electrode 18f and pads 58c are soldered. Thereafter, the space between the mounting surface 14 of the passive component 10g and the surface of the built-in IC substrate 50 is filled with a heat dissipating resin to form the heat dissipating resin layer 60 shown in FIG. 23A.

Since, according to this configuration, the cross section configuration of the inductor 12a is such that the side surface 160a of the inductor 12a inclines so as to spread at the base from the mounting surface 14 side toward the opposed surface 15 side, a formed margin of the solder fillet is provided in the space formed by the substrate and the side surface 160a of the inductor 12a when mounted on the substrate. Thus, a low profile is realized and the space between the passive component and other adjacent passive components can be reduced when mounting, which realizes improved integration efficiency. The load on the solder fillet is reduced even when bending stress or the like is applied to the substrate because the open angles formed by the substrate and the side surface of the passive element are acute angles, thereby preventing the occurrence of defects such as cracking and the like in the solder fillet. Moreover, the number of visually verified apexes in the horizontal plane can be reduced when the passive component 10g is arranged on the built-in IC substrate 50 compared to when the cross section configuration of the inductor 12a spreads at the base from the mounting surface 14 toward the opposed surface 15. Visual inspection by a technician is therefore improved.

In addition, a low profile is realized since the passive component 10g is mounted on a built-in IC substrate 50 in which an IC 53 is embedded within the substrate, and universality and expandability are improved due to the greater freedom in mounting the passive component. As a result, the low profile and high density of passive components ensures universality and expandability.

Since the side surfaces 160a are provided at locations on two sides facing the rectangular mounting surface 14 in the present embodiment, the side surfaces 160a of several passive components 10g can be easily formed by a single dicing in the manufacturing process shown in FIGS. 30A-30E, thus improving mass production efficiency.

According to the present embodiment, the passive component 10g and built-in IC substrate 50 can be securely bonded, thus improving the strength of the electronic component module 100g because the pads 58c, which act as the extractor electrode of the IC 53 to the substrate surface, project from the surface of the built-in IC substrate 50 at positions corresponding to the side surfaces 160a of the passive component 10g such that the pad 58a of the built-in IC substrate 50 can be directly connected to the terminal electrode 18f of the passive component 10g. Furthermore, the wiring distance can be shortened such that noise is reduced and power efficiency is improved by electrically connecting the pad and the terminal electrode of the passive component directly rather than through another passive component, and electrically connecting the terminal electrode and the extractor electrode on the normal line of the substrate surface as shown in the figure.

Since the pad 58c, which is an extractor electrode, is formed within the projection plane when the passive component 10g is projected on the surface of the built-in IC substrate 50 in the present embodiment, the solder fillet collects within the projection plane and is prevented from running outside the plane of projection when the passive component 10g is projected on the surface of the built-in IC substrate 50, thus realizing more improvement in integration efficiency.

Furthermore, an even lower profile can be realized for the electronic component module 100g since at least part of the mounting surface 14 of the passive component 10g and the substrate surface of the built-in IC substrate 50 are in contact in the present embodiment, and heat dissipating characteristics are improved because heat generated by the IC 53 of the built-in IC substrate 50 can escape to the passive component 10g. It is even more desirable to improve heat dissipating characteristics further by having the entire surface of the mounting surface 14 in contact.

Heat dissipating characteristics are further improved in the present embodiment by providing the heat dissipating resin layer 60 on the upper most surface layer of the substrate surface of the built-in IC substrate 50. Moreover, stress is relieves by the contact of the heat-dissipating resin layer 60 with the passive component 10g, thus reducing the load on the terminal electrode 18f and the pad 58c.

In addition, the present embodiment reduces crosstalk caused by the magnetic field generating from the inductor 12a because the terminal electrode 18f is provided at the end of the passive component 10g. Specifically, noise is further reduced by positioning the IC 53 on the inside of the passive component 10g between the pair of terminal electrodes 18f, and it is even more desirable that only a single IC 53 is disposed on the inside of the passive component 10g between the pair of terminal electrodes 18f. Noise is further reduced by the shortened wiring directly connecting the IC 53 and the passive component 10g rather than from the extractor electrode of the IC 53 through the interior region of the passive electrode 10g.

Figure 32:
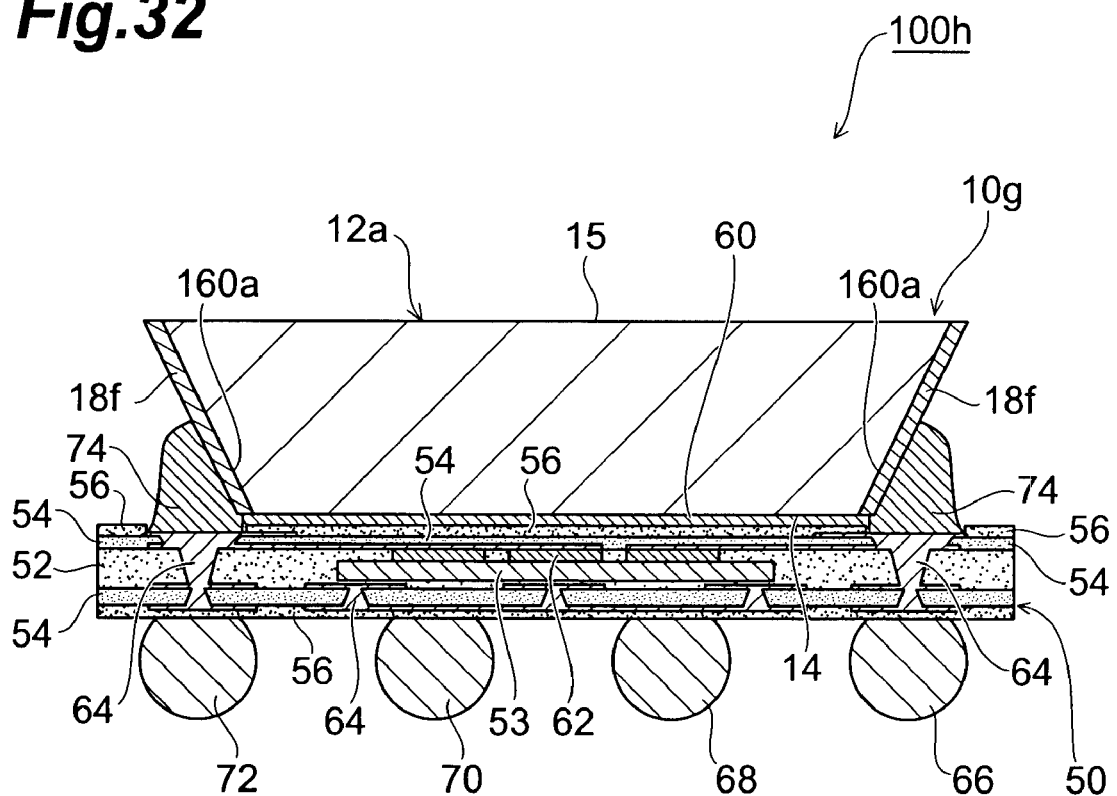
FIG. 32 is a vertical section view showing a tenth embodiment of the electronic component module.

FIG. 32 is a vertical section view showing a tenth embodiment of the electronic component module. In the electronic component module 100h of the present embodiment, the terminal electrode 18f is bonded to the via 64 of the built-in IC substrate 50 by solder 74 alone. Mounting is easier in the present embodiment because provision of the pad 58c is unnecessary. However, solder 74 is retained within the space formed by built-in IC substrate 50 and the side surfaces 160a of the inductor 12a, thus preventing fillet-like spreading by the added action of the resist 56. Therefore, low profile and high density are secured, and mounting is even easier.

The connection between the terminal electrode 18f and the extractor electrode of the built-in IC substrate 50 is not specifically limited and may be suitably adjusted by the size of the side surface 160a as described above using, for example, a method of connecting through a pad 58c such as the copper post using solder, a method of connecting through a post such as the copper post using ultrasonic welding, or a method for connecting directly with solder using a solder paste or solder ball.

Figure 33:
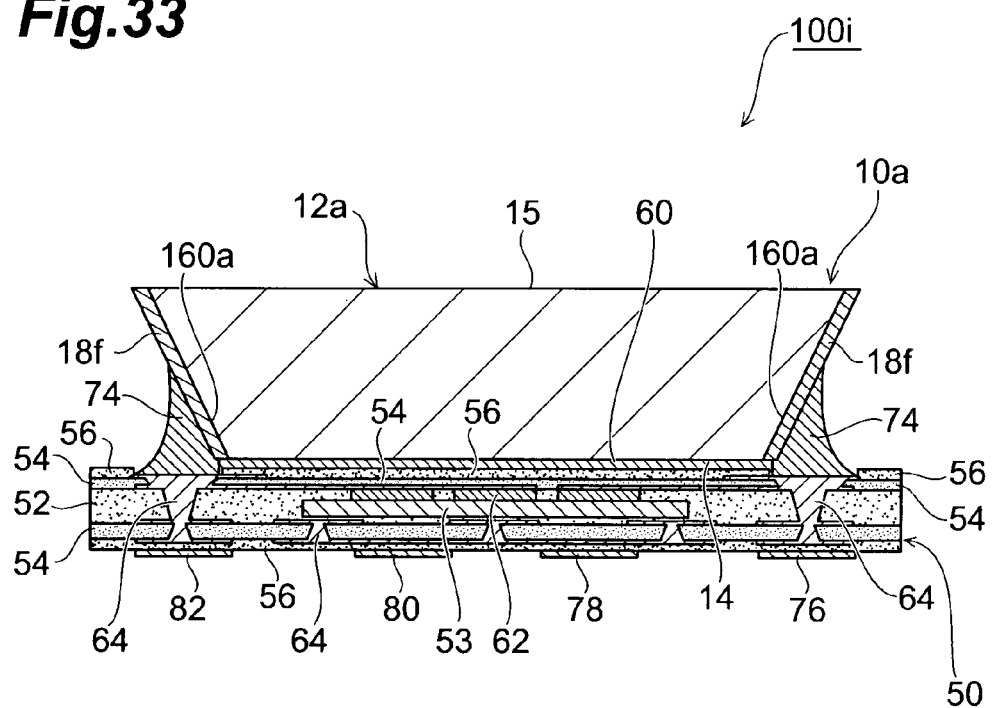
FIG. 33 is a vertical section view showing an eleventh embodiment of the electronic component module.

FIG. 33 is a vertical section view showing an eleventh embodiment of the electronic component module. In the electronic component module 100i of the present embodiment, a $V_{in}$ plate 76, EN plate 78, FB plate 80, and GND plate 82 are substituted for the $V_{in}$ bump 66, EN bump 68, FB bump 70, and GND bump 72 provided on the rear surface of the built-in IC substrate 50 of the tenth embodiment. A lower profile can be realized for the overall electronic component module 100i of the present embodiment by substituting spherical bumps for the thin plates.

Figure 34:
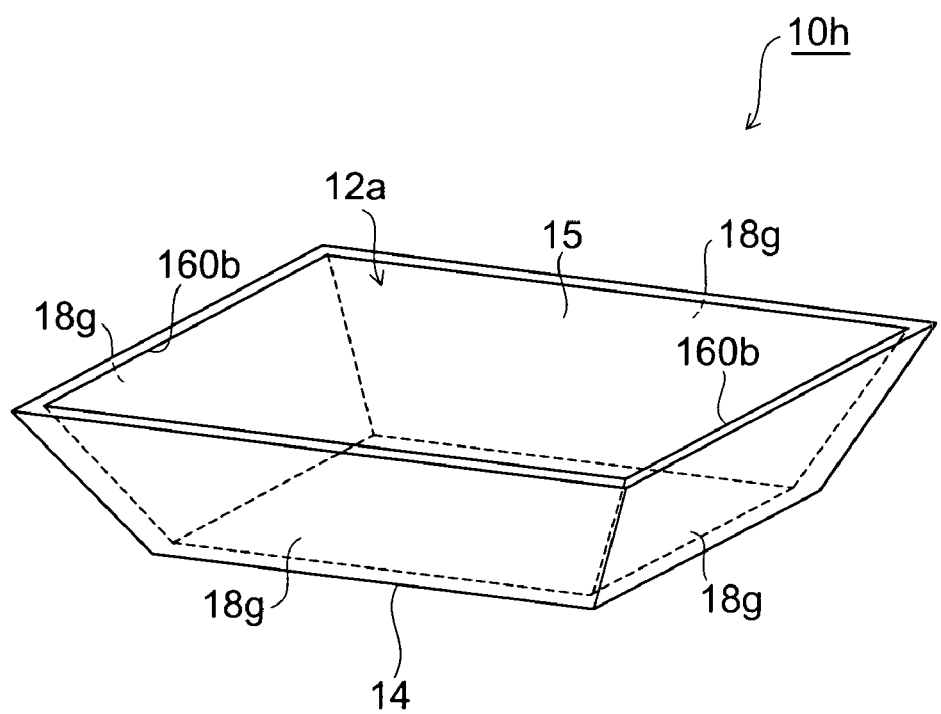
FIG. 34 is a perspective view of the passive component of a twelfth embodiment shown from the side.
Figure 35:
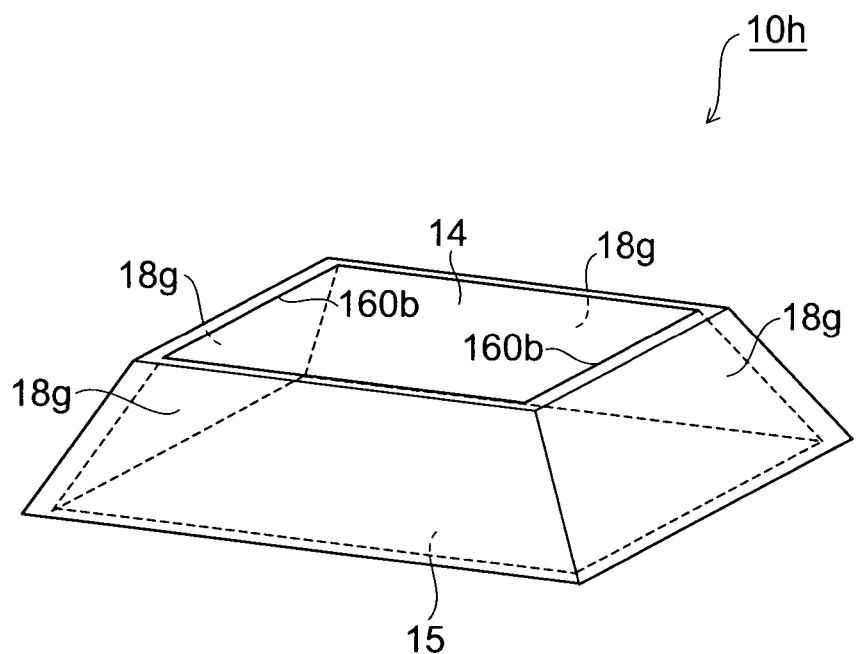
FIG. 35 is a perspective view of the passive component of the twelfth embodiment shown from the bottom side.
Figure 36:
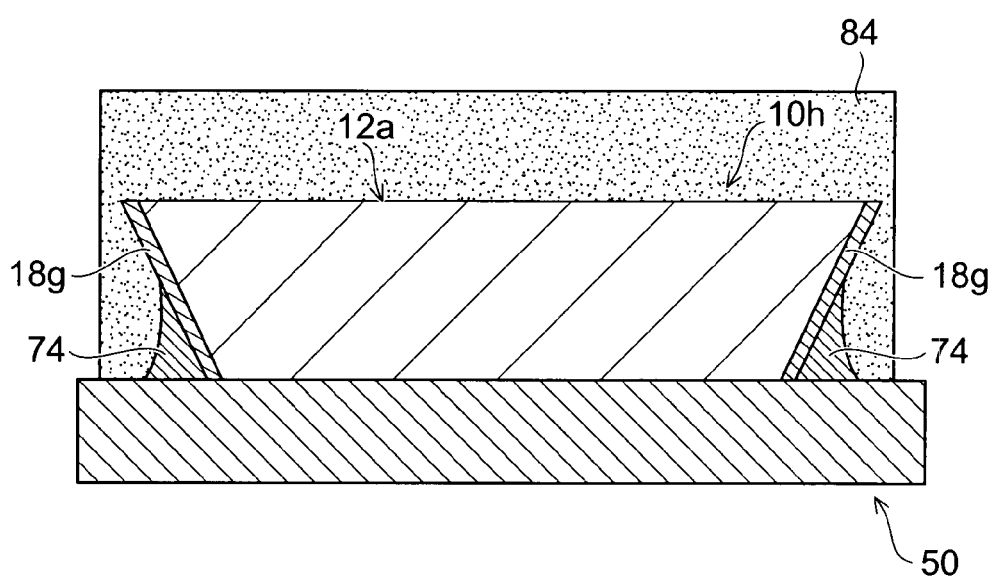
FIG. 36 shows the passive component mounted on the built-in IC substrate in the twelfth embodiment.

FIG. 34 is a perspective view showing the passive component of the twelfth embodiment from the side, and FIG. 35 is a perspective view of the passive component of the twelfth embodiment shown from the bottom side. In the passive component 10h of the present embodiment shown in FIGS. 34 and 35, the terminal electrode 18g is provided on the four side surfaces 160b within the inductor 12a formed as a rectangular parallelepiped. The respective four side surfaces 160b have a cross section configuration in which the cross section is perpendicular to the opposed surface 15 and the mounting surface 14 of the inductor 122a, and inclines so as to spread at the base from the mounting surface 14 toward the opposed surface 15 side.

When mounting the passive component 10h on the built-in IC substrate 50, copper posts 58d are provided on the substrate surface of the built-in IC substrate 50 so as to correspond to the four side surfaces 160b within the mounting surface 14 of the passive component 10g, after which each pad 58d and terminal electrode 18g are bonded, as shown in FIG. 34. With this embodiment, terminal electrodes 18g are provided in four side surfaces 160b made to incline so that the cross-sectional form of inductor 12a may serve as a skirt spread from the mounting surface 14 side toward the opposed surface 15 side. When packaging of the module concerned is carried out by the sealing agent 84, the reliability as a module can be raised by sealing so that the passive component 10h concerned may be covered. In that case, when four side surfaces 160b of passive component 10h are skirt spread form, exfoliation with the sealing agent 84 and built-in IC substrate 50 can be prevented more.

Figure 37:
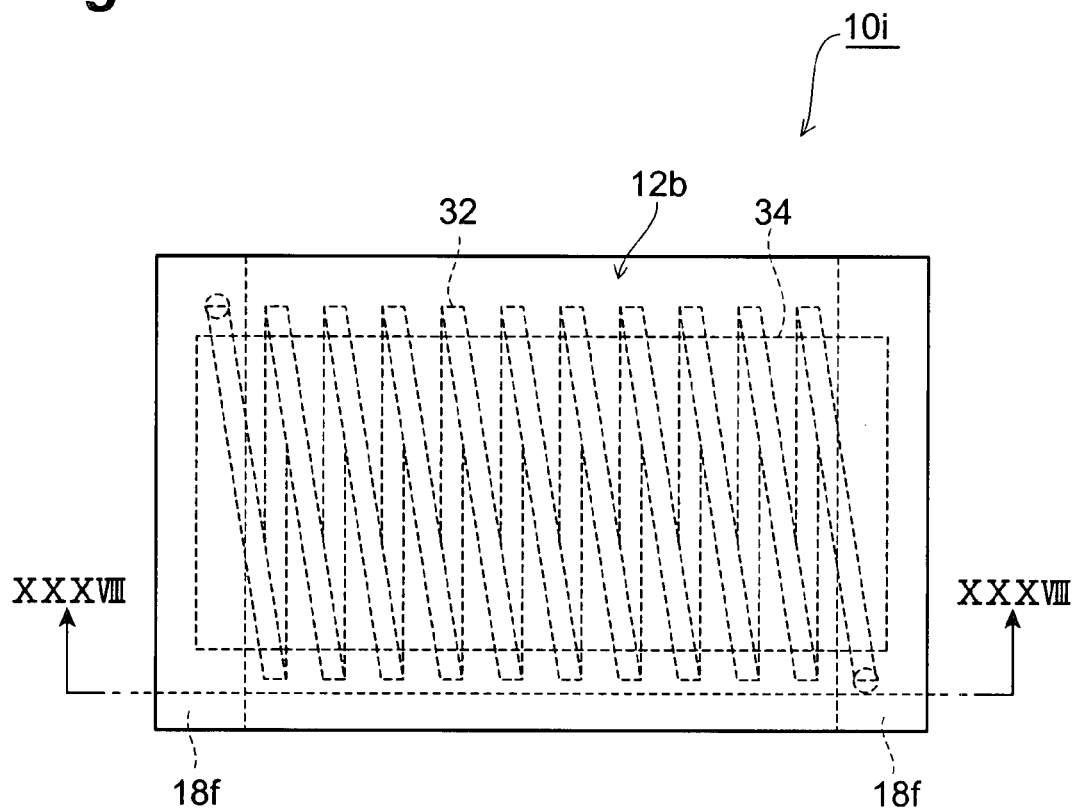
FIG. 37 is a top view showing the internal structure of a thirteenth embodiment of the passive component.

FIG. 37 is a top view showing the internal structure of a thirteenth embodiment of the passive component. As shown in FIG. 37, the passive component 10i of the present embodiment is provided with a wound type of inductor as the inductor 12b. In this embodiment, a solenoid winding 32 is wound on a ferrite core 34, the length of which is disposed parallel to the mounting surface 14. The inductor characteristics are excellent in this embodiment.

Figure 38:
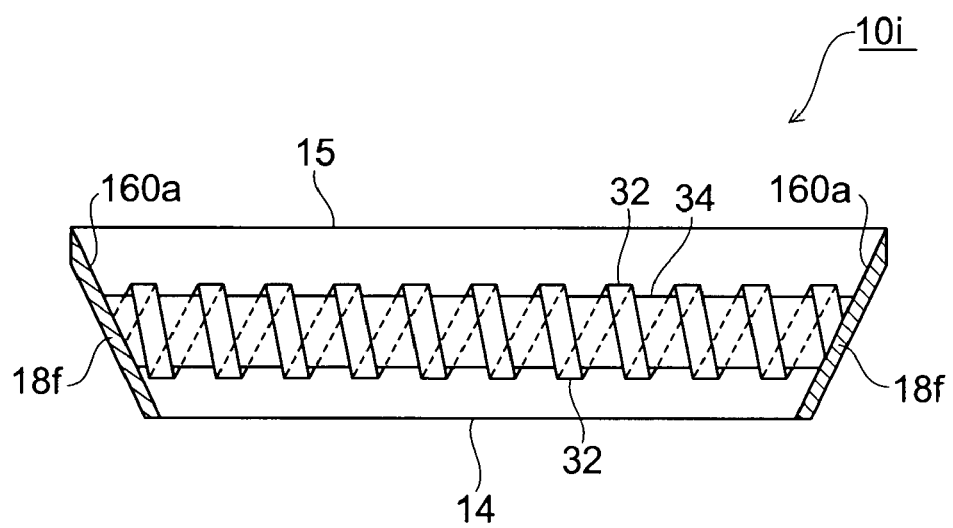
FIG. 38 is a vertical section view showing the thirteenth embodiment of the passive component.

FIG. 38 is a vertical section view showing the thirteenth embodiment of the passive component and shows the section by the XXVIII line in FIG. 37. As shown in FIG. 38, the inductor 12b can be realized in minimum dimensions relative to volume by the exclusive occupancy of the solenoid winding 32 of the inductor 12b in any part other than the part of the passive component 10i on the mounting surface 14 side.

Figure 39:
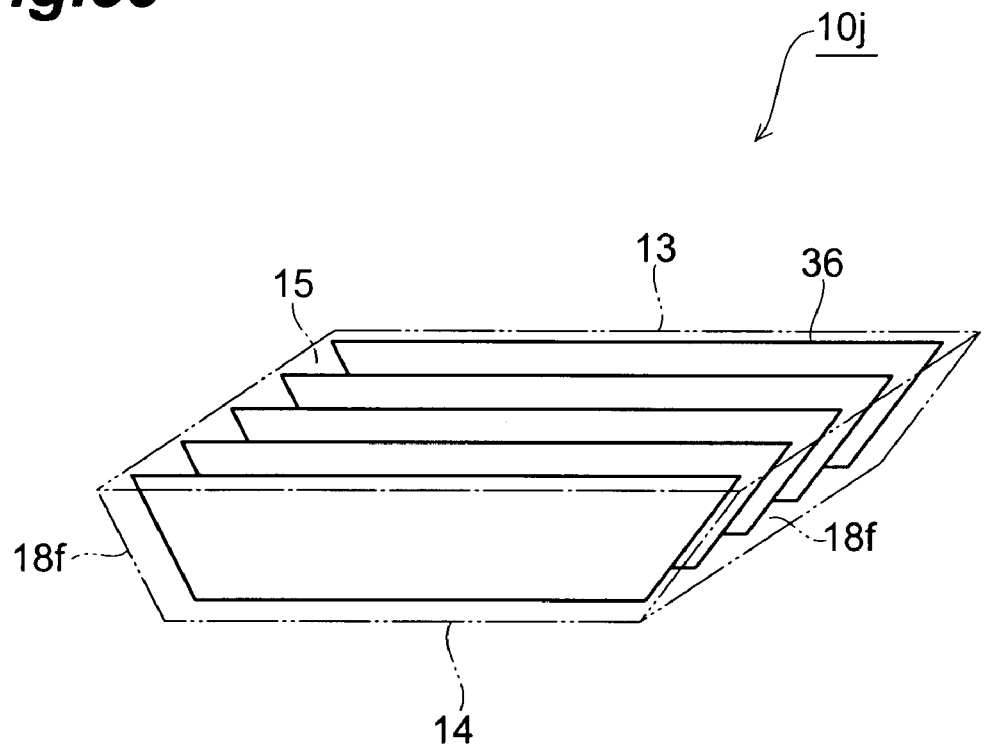
FIG. 39 is a see-through perspective view showing the internal structure of a fourteenth embodiment of the passive component.

FIG. 39 is a see-through perspective view showing the internal structure of a fourteenth embodiment of the passive component. The passive component 10j of the present embodiment shown in FIG. 39 is provided with a capacitor 13 as a passive element, and has a plurality of capacitor electrodes 36 disposed in parallel within the capacitor 13. The capacitor electrodes 36 are arranged perpendicular to the mounting surface 14, and the capacitor electrodes 36 can easily be electrically connected on the mounting surface 14 side.

Figure 40:
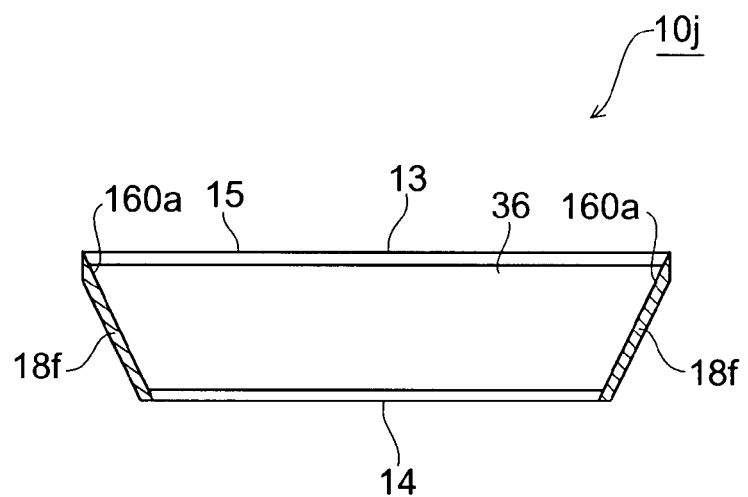
FIG. 40 is a vertical section view showing the fourteenth embodiment of the passive component.

FIG. 40 is a vertical section view showing the fourteenth embodiment of the passive component. As shown in FIG. 40, since the capacitor electrodes 36 have a shape corresponding to side surfaces 160a, the capacitor 13 can be realized in minimum dimensions relative to volume by the exclusive occupancy of the capacitor electrodes 36 of the capacitor 13 in any part other than the part of the passive component 10j on the mounting surface 14 side that includes side surfaces 160a.

Although the present invention has been described in terms of the embodiments, the present invention is not limited to these embodiments, and may be variously modified. For example, although the above embodiments have been described by way of examples in which a passive component that incorporates an inductor as a passive element is mounted on a built-in IC substrate. the present invention is not limited to this configuration inasmuch as a passive component that incorporates a capacitor or resistor element as a passive element may also be mounted on a built-in IC substrate.

What is claimed is:

1. An electronic component module comprising:
a built-in IC substrate; and
a passive component provided with a mounting surface for mounting on the built-in IC substrate, an opposed surface in opposition to the mounting surface, a side surface that intersects the mounting surface and the opposed surface, and a terminal electrode provided on the side surface, a cross section of the passive component taken perpendicular to the opposed surface and the mounting surface having a trapezoidal shape, the cross section having a length along the mounting surface that is shorter than a length along the opposed surface; wherein the built-in IC substrate comprises an IC embedded within a support substrate and has an extractor electrode disposed at a front surface of the built-in IC substrate at a position corresponding to the side surface of the passive component and has a via electrically connected from the extractor electrode, which is formed so as to pass through the front and a rear surface of the built-in IC substrate at a position corresponding to the side surface of the passive component;

the extractor electrode of the built-in IC substrate is directly connected to the terminal electrode of the passive component, the terminal electrode provided on the side surface of the passive component;

the passive component is an inductor;

the inductor has a laminated configuration having a first winding on the opposed surface side, an insulating substrate, and a second winding on the mounting surface side;

the first winding and the second winding have a shape of a spiral on front and rear surfaces of the insulating substrate, respectively, an inner end of the first winding and an inner end of the second winding are connected to each other with the insulating substrate between them; and an outer end of the first winding and an outer end of the second winding are electrically connected directly to the terminal electrode.

2. The electronic component module according to claim 1, wherein the first winding and the second winding have the shape of a spiral around a ferrite core.

3. The electronic component module according to claim 1, wherein the extractor electrode is formed within a projection area when the passive component is projected on the front surface of the built-in IC substrate.

4. The electronic component module according to claim 1, wherein at least a part of the mounting surface of the passive component and a part of a substrate surface of the built-in IC substrate are in contact.

5. The electronic component module according to claim 4, wherein the built-in IC substrate comprises a heat dissipating resin layer as an outermost layer of the front surface of the built-in IC substrate.

6. The electronic component module according to claim 1, wherein the terminal electrode is entirely on the side surface.

* * * * *